United States Patent
Hughes et al.

(10) Patent No.: US 11,460,753 B2
(45) Date of Patent: Oct. 4, 2022

(54) SYSTEMS AND METHODS FOR ACTIVATION FUNCTIONS FOR PHOTONIC NEURAL NETWORKS

(71) Applicant: The Board of Trustees of the Leland Stanford Junior University, Stanford, CA (US)

(72) Inventors: Tyler William Hughes, Stanford, CA (US); Momchil Minkov, Stanford, CA (US); Ian Williamson, Stanford, CA (US); Shanhui Fan, Stanford, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 0 days.

(21) Appl. No.: 17/054,127

(22) PCT Filed: May 10, 2019

(86) PCT No.: PCT/US2019/031748
§ 371 (c)(1),
(2) Date: Nov. 9, 2020

(87) PCT Pub. No.: WO2019/217836
PCT Pub. Date: Nov. 14, 2019

(65) Prior Publication Data
US 2021/0116781 A1      Apr. 22, 2021

Related U.S. Application Data

(60) Provisional application No. 62/815,243, filed on Mar. 7, 2019, provisional application No. 62/669,899, filed on May 10, 2018.

(51) Int. Cl.
*G02F 1/35*     (2006.01)
*G06N 3/067*    (2006.01)
(Continued)

(52) U.S. Cl.
CPC ............ *G02F 1/3517* (2013.01); *G02F 1/365* (2013.01); *G06N 3/0481* (2013.01); *G06N 3/0675* (2013.01)

(58) Field of Classification Search
CPC .................................................... G02F 1/3517
See application file for complete search history.

(56) References Cited

U.S. PATENT DOCUMENTS

| 6,374,385 B1 | 4/2002 | Hamalainen et al. |
| 10,268,232 B2 * | 4/2019 | Harris ...................... G06E 3/003 |

(Continued)

FOREIGN PATENT DOCUMENTS

| EP | 0502943 B1 | 2/1999 |
| EP | 1255157 A1 | 11/2002 |

(Continued)

OTHER PUBLICATIONS

A. N. Tait et al., "Demonstration of a silicon photonic neural network,"2016 IEEE Photonics Society Summer Topical Meeting Series (SUM), 2016, pp. 72-73. (Year: 2016).*

(Continued)

*Primary Examiner* — Rhonda S Peace
(74) *Attorney, Agent, or Firm* — KPPB LLP

(57) ABSTRACT

Systems and methods for activation in an optical circuit in accordance with embodiments of the invention are illustrated. One embodiment includes an optical activation circuit, wherein the circuit comprises a directional coupler, an optical-to-electrical conversion circuit, a time delay element, a nonlinear signal conditioner, and a phase shifter. The directional coupler receives an optical input and provides a first portion to the optical-to-electrical conversion circuit and a second portion to the time delay element, the time delay element provides a delayed signal to the phase shifter, and the optical-to-electrical conversion circuit converts an (Continued)

optical signal from the directional coupler to an electrical signal used to activate the phase shifter to shift the phase of the delayed signal.

8 Claims, 10 Drawing Sheets

(51) Int. Cl.
　　　*G02F 1/365* 　　　(2006.01)
　　　*G06N 3/04* 　　　(2006.01)

(56) References Cited

U.S. PATENT DOCUMENTS

| | | | |
|---|---|---|---|
| 2004/0107172 | A1 | 6/2004 | Wang |
| 2007/0047966 | A1* | 3/2007 | Hironishi ............. H04B 10/677 398/161 |
| 2008/0050124 | A1* | 2/2008 | Tsuchida ............... G02F 1/3517 398/188 |
| 2008/0154815 | A1 | 6/2008 | Martinez |
| 2011/0188800 | A1 | 8/2011 | Futami |
| 2012/0070151 | A1* | 3/2012 | Shin ................... H04B 10/5053 398/43 |
| 2013/0294782 | A1* | 11/2013 | Liboiron-Ladouceur ................... H03M 13/458 398/202 |
| 2015/0078754 | A1* | 3/2015 | Aflatouni ........... H04B 10/2575 398/116 |
| 2015/0261058 | A1 | 9/2015 | Silverstone et al. |
| 2016/0162798 | A1 | 6/2016 | Marandi et al. |
| 2017/0148433 | A1 | 5/2017 | Catanzaro et al. |
| 2017/0351293 | A1 | 12/2017 | Carolan et al. |
| 2017/0351952 | A1 | 12/2017 | Zhang et al. |
| 2018/0089558 | A1 | 3/2018 | Wittenberg et al. |
| 2021/0116781 | A1* | 4/2021 | Hughes .................. G06V 10/94 |
| 2021/0356738 | A1 | 11/2021 | Fan et al. |

FOREIGN PATENT DOCUMENTS

| | | | |
|---|---|---|---|
| WO | 2017210550 | A1 | 12/2017 |
| WO | 2017214729 | A1 | 12/2017 |
| WO | 2019217835 | A1 | 11/2019 |

OTHER PUBLICATIONS

I. A. D. Williamson, T. W. Hughes, M. Minkov, B. Bartlett, S. Pai and S. Fan, "Tunable Nonlinear Activation Functions for Optical Neural Networks," 2020 Conference on Lasers and Electro-Optics (CLEO), 2020, pp. 1-2. (Year: 2020).*
B. S. Leelar, E. S. Shivaleela and T. Srinivas, "Learning with Deep Photonic Neural Networks," 2017 IEEE Workshop on Recent Advances in Photonics (WRAP), 2017, pp. 1-7. (Year: 2017).*
L. De Marinis, M. Cococcioni, P. Castoldi and N. Andriolli, "Photonic Neural Networks: A Survey," in IEEE Access, vol. 7, pp. 175827-175841, 2019. (Year: 2019).*
I. A. D. Williamson, T. W. Hughes, M. Minkov, B. Bartlett, S. Pai and S. Fan, "Reprogrammable Electro-Optic Nonlinear Activation Functions for Optical Neural Networks," in IEEE Journal of Selected Topics in Quantum Electronics, vol. 26, No. 1, pp. 1-12, Jan.-Feb. 2020. (Year: 2020).*
M. J. Filipovich, Z. Guo, B. A. Marquez, H. D. Morison and B. J. Shastri, "Training Deep Neural Networks in Situ with Neuromorphic Photonics," 2020 IEEE Photonics Conference (IPC), 2020, pp. 1-2. (Year: 2020).*
International Preliminary Report on Patentability for International Application PCT/US2019/031747 Report dated Nov. 10, 2020, dated Nov. 19, 2020, 4 Pgs.
International Preliminary Report on Patentability for International Application PCT/US2019/031748 Report dated Nov. 10, 2020, dated Nov. 19, 2020, 4 Pgs.
International Search Report and Written Opinion for International Application No. PCT/US2019/031747, Search completed Jul. 10, 2019, dated Jul. 24, 2019, 9 Pgs.
International Search Report and Written Opinion for International Application No. PCT/US2019/031748, Search completed Jul. 12, 2019, dated Jul. 29, 2019, 9 Pgs.
"Artificial Intelligence Funding Trends", Retrieved from https://venturescanner.medium.com/artificial-intelligence-funding-trends-q3-2017-4e8a9b80fe53, published online on Sep. 2, 2017, 3 pages.
Miller, "Arbitrary and Reconfigurable Optics—New Opportunities for Integrated Photonics", Frontiers in Optics 2017, OSA Technical Digest (online) (Optica Publishing Group, 2017), paper FTu4A.1, 1 pg., https://doi.org/10.1364/FIO.2017.FTu4A.1.
Miller, "Attojoule Optoelectronics for Low-Energy Information Processing and Communications", Journal of Lightwave Technology, vol. 35, Issue 3, Feb. 1, 2017, pp. 346-396, DOI: 10.1109/JLT.2017.2647779.
Miller, "Perfect optics with imperfect components", Optica, vol. 2, Issue 8, 2015, pp. 747-750, https://doi.org/10.1364/OPTICA.2.000747.
Miller, "Self-aligning universal beam coupler", Optics Express vol. 21, Issue 5, Mar. 11, 2013, first published Mar. 6, 2013, pp. 6360-6370, https://doi.org/10.1364/OE.21.006360.
Miller, "Setting up meshes of interferometers—reversed local light interference method", Optics Express, vol. 25, Issue 23, Nov. 13, 2017, pp. 29233-29248, https://doi.org/10.1364/OE.25.029233.
Miller et al., "Self-configuring universal linear optical component [Invited]", Photonics Research. vol. 1, Issue 1, Jun. 2013, pp. 1-15, https://doi.org/10.1364/PRJ.1.000001.
Minkov et al., "Inverse Design of Photonic Crystals through Automatic Differentiation", ACS Photonics, vol. 7, 2020, pp. 1729-1741, https://dx.doi.org/10.1021/acsphotonics.0c00327.
Ng et al., "Ultra-High Aspect Ratio Trenches in a Single crystal silicon with epatixial gap tuning", 2013 Transducers and Eurosensors XXVII: The 17th International Conference on Solid-State Sensors, pp. 182-185.
Nozaki et al., "Amplifier-Free Bias-Free Receiver Based on Low-Capacitance Nanophotodetector", IEEE Journal of Selected Topics in Quantum Electronics, vol. 24, Issue: 2, Mar.-Apr. 2018, first published Dec. 20, 2017, DOI: 10.1109/JSTQE.2017.2777105.
Pai et al., "Matrix optimization on universal unitary photonic devices", arXiv:1808.00458v3 [eess.SP] May 22, 2019, 18 pgs.
Pallipuram et al., "A comparative study of GPU programming models and architectures using neural networks", The Journal of Supercomputing, vol. 61, Sep. 2012, first published May 31, 2011, pp. 673-718, https://doi.org/10.1007/s11227-011-0631-3.
Park et al., "Monolayer graphene saturable absorbers with strongly enhanced evanescent-field interaction for ultrafast fiber laser modelocking", Optics Express vol. 23, Issue 15, Jul. 27, 2015, first published Jul. 22, 2015, pp. 19806-19812, https://doi.org/10.1364/OE.23.019806.
Paszke et al., "PyTorch: An Imperative Style, High-Performance Deep Learning Library", 33rd Conference on Neural Information Processing Systems (NeurIPS 2019), Vancouver, Canada, 12 pgs.
Peng et al., "Neuromorphic Photonic Integrated Circuits", IEEE Journal of Selected Topics in Quantum Electronics , vol. 24, Issue: 6, Nov.-Dec. 2018, DOI: 10.1109/JSTQE.2018.2840448.
Prezioso et al., "Training and operation of an integrated neuromorphic network based on metal-oxide memristors", Nature, vol. 521, May 7, 2015, pp. 61-64, includes supplementary info, doi: 10.1038/nature14441.
Psaltis et al., "Adaptive optical networks using photorefractive crystals", Applied Optics, vol. 27, No. 9. May 1, 2019, pp. 1752-1759.
Psaltis et al., "Holography in artificial neural networks", Nature, vol. 343, Jan. 25, 1990, pp. 325-330.
Reck et al., "Experimental realization of any discrete unitary operator", Physical Review Letters, vol. 73, No. 1, Jul. 1, 1994, pp. 58-61, doi: 10.1103/PhysRevLett.73.58.
Rosenbluth et al., "A high performance photonic pulse processing device", Optics Express, vol. 17, Issue 25, Dec. 2009, first published Nov. 30, 2009, p. 22767-22772, https://doi.org/10.1364/OE.17.022767.

(56) References Cited

OTHER PUBLICATIONS

Schevenels et al., "Robust topology optimization accounting for spatially varying manufacturing errors", Computer Methods in Applied Mechanics and Engineering, vol. 200, Issues 49-52, Dec. 1, 2011, published online Aug. 26, 2011, pp. 3613-3627, https://doi.org/10.1016/j.cma.2011.08.006.

Sell et al., "Large-Angle, Multifunctional Metagratings Based on Freeform Multimode Geometries", Nano Letters, vol. 17, No. 6, May 1, 2017, pp. 3752-3757, DOI: 10.1021/acs.nanolett.7b01082.

Settaluri et al., "First Principles Optimization of Opto-Electronic Communication Links", IEEE Transactions on Circuits and Systems-I: Regular Papers, vol. 64, No. 5, May 2017, pp. 1270-1283, 10.1109/TCSI.2016.2633942.

Shadbolt et al., "Generating, manipulating and measuring entanglement and mixture with a reconfigurable photonic circuit", Nature Photonics, vol. 6, Jan. 2012, first published Dec. 11, 2011, pp. 45-49. https://doi.org/10.1038/nphoton.2011.283.

Shainline et al., "Superconducting Optoelectronic Circuits for Neuromorphic Computing", Phys. Rev. Applied vol. 7, No. 3, 034013, Mar. 23, 2017, pp.

Shastri et al., "Spike processing with a graphene excitable laser", Scientific Reports, vol. 6, No. 19126, 2016, 12 pages.

Shen et al., "An integrated-nanophotonics polarization beamsplitter with 2.4 x 2.4 pm2 footprint", Nature Photonics, vol. 9, Jun. 2015, first published May 18, 2015, pp. 378-382, https://doi.org/10.1038/nphoton.2015.80.

Shen et al., "Deep learning with coherent nanophotonic circuits", Nature Photonics, 2017, vol. 11, pp. 441-446, https://doi.org/10.1038/nphoton.2017.93.

Shi et al., "Optimization of Multilayer Optical Films with a Memetic Algorithm and Mixed Integer Programming", ACS Photonics, ACS Photonics, Just Accepted Manuscript, published online Dec. 15, 2017, 24 pgs., https://doi.org/10.1021/acsphotonics.7b01136.

Shin et al., "Choice of the perfectly matched layer boundary condition for frequency-domain Maxwell's equations solvers", Journal of Computational Physics, vol. 231, Issue 8, Apr. 20, 2012, pp. 3406-3431, https://doi.org/10.1016/j.jcp.2012.01.013.

Spring et al., "Boson Sampling on a Photonic Chip", Science, vol. 339, Issue 6121, Dec. 20, 2012, pp. 798-801, DOI: 10.1126/science.1231692.

Srivastava et al., "Dropout: A Simple Way to Prevent Neural Networks from Overfitting", Journal of Machine Learning Research, vol. 15, No. 1, June 1. 2014, pp. 1929-1958.

Su et al., "Fully-automated optimization of grating couplers", Optics Express, vol. 26, No. 4, Feb. 4, 2018, pp. 4023-4034, https://doi.org/10.1364/OE.26.004023.

Sun et al., "Large-scale nanophotonic phased array", Nature, vol. 493, Jan. 10, 2013, first published Jan. 9, 2013, pp. 195-199, https://doi.org/10.1038/nature11727.

Tait et al., "A silicon photonic modulator neuron", arXiv:1812.11898v1 [physics.app-ph] Dec. 9, 2018, 16 pgs.

Tait et al., "Broadcast and Weight: An Integrated Network For Scalable Photonic Spike Processing", Journal of Lightwave Technology, vol. 32, 2014, pp. 4029-4041.

Tait et al., "Neuromorphic photonic networks using silicon photonic weight banks", Scientific Reports, vol. 7, No. 7430, Aug. 7, 2017, 19 pgs., DOI: 10.1038/S41598-017-07754-z.

Tait et al., "The Dream: An Integrated Photonic Thresholder", Journal of Lightwave Technology IEEE USA, vol. 31. No. 8, Apr. 15, 2013, pp. 1263-1272, DOI: 10.1109/JLT.2013.2246544.

Trabelsi et al., "Deep Complex Networks", arXiv:1705.09792v4 [cs.NE] Feb. 25, 2018, 19 pgs.

Trentin, "Networks with trainable amplitude of activation functions", Neural Networks, vol. 14, Issues 4-5, May 2001, pp. 471-493, https://doi.org/10.1016/S0893-6080(01)00028-4.

Vandoorne et al., "Experimental demonstration of reservoir computing on a silicon photonics chip", Nature Communications, vol. 5, No. 3541, Mar. 24, 2014, 6 pgs., https://doi.org/10.1038/ncomms4541.

Vercruysse et al., "Analytical level set fabrication constraints for inverse design", Scientific Reports, vol. 9, No. 8999, 2019, published online Jun. 21, 2019, 7 pgs., https://doi.org/10.1038/s41598-019-45026-0.

Veronis et al., "Method for sensitivity analysis of photonic crystal devices", Optics Letters vol. 29, Issue 19, Oct. 1, 2004, pp. 2288-2290, https://doi.org/10.1364/OL.29.002288.

Meu et al., "Electron beam lithography: resolution limits and applications", Applied Surface Science, Sep. 1, 2000, vol. 164, Issues 1-4, pp. 111-117, https://doi.org/10.1016/S0169-4332(00)00352-4.

Wagner et al., "Multilayer optical learning networks", Applied Optics, vol. 26, Issue 23, 1987, pp. 5061-5076, https://doi.org/10.1364/AO.26.005061.

Wang et al., "Robust design of topology-optimized metasurfaces", Optical Materials Express, vol. 9, No. 2, Feb. 1, 2019, published online Jan. 10, 2019, pp. 469-482, https://doi.org/10.1364/OME.9.000469.

Wills, "Doing Neural Nets with Photons", The Optical Society, Jun. 19, 2017, 4 pgs.

Woods et al., "Photonic Neural Networks", Optical Computing, vol. 8, Apr. 2012, pp. 257-259.

Wu et al., "High aspect ratio silicon etch: A review", Journal of Applied Physics, 2010, vol. 108, pp. 051101-1-051101-20.https://doi.org/10.1063/1.3474652.

Yablonovitch et al., "Optical projection lithography at half the Rayleigh Yesolution limit by two photon exposure", Opt. Eng., 1998, Materials, fundamentals and Applications Topical Meeting, 1998, pp. 126-128.

Yeom et al., "Maximum achievable aspect ratio in deep reactive ion etching of silicon due to aspect ratio dependent transport and the microloading effect", Journal of Vacuum Science and Technology, vol. 23, Nov./Dec. 2005, pp. 2319-2329, DOI:10.1116/1.2101678.

Yu et al., "A low-noise high-gain transimpedance amplifier with high dynamic Yange in 0.13im CMOS", IEEE International Symposium on Radio-Frequency Integration Technology (RFIT), Nov. 2012, pp. 37-40, DOI:10.1109/RFIT.2012.6401606.

Yu et al., "Design of AGC amplifier for CMOS Image Sensor", 2012 IEEE International Symposium on Radio-Frequency Integration Technology (RFIT), Nov. 21-23, 2012, pp., DOI: 10.1109/RFIT.2012.6401605.

Zhou et al., "Minimum length scale in topology optimization by geometric constraints", Computer Methods in Applied Mechanics and Engineering, vol. 293, Aug. 15, 2015, pp. 266-282, DOI: 10.1016/j.cma.2015.05.003.

Abu-Mostafa et al., "Optical Neural Computers", Scientific American, vol. 256, No. 3, Mar. 1987, pp. 88-95, https://www.jstor.org/stable/24979343.

Extended European Search Report for European Application No. 19799849.5, Search completed Nov. 30, 2021, dated Dec. 16, 2021, 11 Pgs.

Extended European Search Report for European Application No. 19799982.4, Search completed Jan. 18, 2022, dated Feb. 3, 2022, 12 Pgs.

Ahmed et al., "A 100 GB/s transimpedance amplifier in 65 nm CMOS technology for optical communications", 2014 IEEE International Symposium on Circuits and Systems (ICAS), Jun. 1-5, 2014, pp. 1885-1888, DOI: 10.1109/ISCAS.2014.6865527.

Alibart et al., "Pattern classification by memristive crossbar circuits using ex situ and in situ training", Nature Communications, vol. 4, Issue 2072. Jun. 25, 2013, 7 pgs., https://doi.org/10.1038/ncomms3072.

Annoni et al., "Unscrambling light—automatically undoing strong mixing between modes", Light: Science & Applications, vol. 6, e17110, Dec. 1, 2017, article preview online Jun. 30, 2017, 10 pgs., doi:10.1038/lsa.2017.110.

Azunre et al., "Guaranteed global optimization of thin-film optical systems", New Journal of Physics, Jul. 24, 2019, vol. 21, 073050, 19 pgs., https://doi.org/10.1088/1367-2630-ab2e19.

Bao et al., "Monolayer Graphene as a Saturable Absorber in a Mode-Locked Laser", Nano Research, vol. 4, No. 3, 2011, pp. 297-307, DOI 10.1007/s 12274-010-0082-9.

(56) References Cited

OTHER PUBLICATIONS

Bayati et al., "Inverse Designed Metalenses with Extended Depth of Focus", ACS Photonics, vol. 7, Mar. 25, 2020, pp. 873-878, https://dx.doi.org/10.1021/acsphotonics.9b01703.

Brunner et al., "Parallel photonic information processing at gigabyte per second data rates using transient states", Nature Communications, vol. 4, Jan. 15, 2013, pp. 1364-1367, https://doi.org/10.1038/ncomms2368.

Capmany et al., "Microwave photonics combines two worlds", Nature Photonics, vol. 1, Jun. 1, 2007, pp. 319-330, DOI:10.1038/nphoton.2007.89.

Carolan et al., "Universal linear optics", Science, vol. 349, Issue 6249, Aug. 14, 2015, pp. 711-716, DOI: 10.1126/science.aab3642.

Chung et al., "High-NA achromatic metalenses by inverse design", Optics Express, vol. 28, No. 5, Mar. 2, 2020, first published Feb. 24, 2020, pp. 6945-6965, DOI:https://doi.org/10.1364/OE.385440.

Clements et al., "Optimal design for universal multiport interferometers", Optica vol. 3, Issue 12, Dec. 2016, pp. 1460-1465, https://doi.org/10.1364/OPTICA.3.001460.

Crespi et al., "Anderson localization of entangled photons in an integrated quantum walk", Nature Photonics, vol. 7, Apr. 2013, first published Mar. 3, 2013, pp. 322-328, https://doi.org/10.1038/nphoton.2013.26.

Crespi et al., "Integrated multimode interferometers with arbitrary designs for photonic boson sampling", Nature Photonics, vol. 7, Jul. 2013, first published May 26, 2013, pp. 545-549, https://doi.org/10.1038/nphoton.2013.112.

Depuy et al., "59-dBOmega 68-GHz Variable Gain-Bandwidth Differential Linear TIA in 0.7-µm InP DHBT for 400-GB/s Optical Communication Systems", 2015 IEEE Compound Semiconductor Integrated Circuit Symposium (CSICS), Oct. 11-14, 2015, pp. , DOI: 10.1109/CSICS.2015.7314463.

Duport et al., "Fully analogue photonic reservoir computer", Scientific Reports, vol. 6, No. 22381, 12 pgs., DOI: 10.1038/srep22381.

Egorov et al., "Genetically optimized all-dielectric metasurfaces", Optics Express, vol. 25, No. 3, Feb. 7, 2017, first published Feb. 1, 2017, pp. 2583-2593, https://doi.org/10.1364/OE.25.002583.

Fan, "Freeform metasurface design based on topology optimization", MRS Bulletin, vol. 45, Mar. 2020, pp. 196-201, doi:10.1557/mrs.2020.62.

Frei et al., "Geometry projection method for optimizing photonic nanostructures", Optics Letters, vol. 32, Issue 1, Jan. 1, 2007, first published Dec. 13, 2006, pp. 77-79, https://doi.org/10.1364/OL.32.000077.

Georgieva et al., "Feasible adjoint sensitivity technique for EM design optimization", IEEE Transactions on Microwave Theory and Techniques, vol. 50, Issue 12, Dec. 2002, pp. 2751-2758, DOI; 10.1109/TMTT.2002.805131.

Ghelfi et al., "A fully photonics-based coherent radar system", Nature, vol. 507, Mar. 20, 2014, first published Mar. 19, 2014, pp. 341-345, https://doi.org/10.1038/nature13078.

Goodfellow et al., "Deep Learning", The MIT Press, Cambridge, Massachusetts, 2016, 26 pgs.

Graves et al., "Hybrid computing using a neural network with dynamic external memory", Nature, vol. 538, Oct. 27, 2016, first published Oct. 12, 2016, pp. 471-476, https://doi.org/10.1038/nature20101.

Graves et al., "Neural Turing Machines", arXiv: 1410.5401v2 [cs.NE], Dec. 10, 10, 2014, 26 pgs.

Green, "Self-consistent optical parameters of intrinsic silicon at 300 K including temperature coefficients", Solar Energy Materials and Solar Cells, vol. 92, No. 11, Nov. 2008, pp. 1305-1310, doi:10.1016/j.solmat.2008.05.0009.

Harris, "Programmable nanophotonics for quantum information processing and artificial intelligence", Thesis, Massachusetts Institute of Technology, 2017, 126 pgs.

Harris et al., "Quantum transport simulations in a programmable nanophotonic processor", Nature Photonics, vol. 11, 2017, pp. 447-452, https://doi.org/10.1038/nphoton.2017.95.

Hermans et al., "Photonic Delay Systems as Machine Learning Implementation", Journal of Machine Learning Research, vol. 16, 2015, pp. 2081-2097.

Hermans et al., "Towards trainable media: Using waves for neural networkstyle training", arXiv preprint arXiv: 1510.03776, Sep. 30, 2015, 20 pgs.

Hermans et al., "Trainable hardware for dynamical computing using error backpropagation through physical media", Nature Communications, vol. 6, Issue. 6729, Mar. 24, 2015, 8 pgs., DOI: https://doi.org/10.1038/ncomms7729.

Hughes et al., "Training of photonic neural networks through in situ backpropagation and gradient measurement", Optica, vol. 5, No. 7, Jul. 2018, first published Jul. 19, 2018, pp. 864-871, https://doi.org/10.1364/OPTICA.5.000864.

Hughes et al., "Forward-Mode Differentiation of Maxwell's Equations", ACS Photonics, Oct. 21, 2019, vol. 6, pp. 3010-3016, DOI: 10.1021/acsphotonics.9b01238.

Hughes et al., "Method for computationally efficient design of dielectric laser accelerator structures", Optics Express, vol. 25, Issue 13, Jun. 26, 2017, pp. 15414-15427, https://doi.org/10.1364/OE.25.015414.

Hughes et al., "On-Chip Laser Power Delivery System for Dielectric Laser Accelerators", arXiv: 1709.04441v1 [physics.optics], Sep. 13, 2017, 14 pgs.

Jensen et al., "Topology optimization of photonic crystal structures: a high-bandwidth low-loss T-junction waveguide", Journal of the Optical Society of America B, vol. 22, Issue 6, Jun. 2005, pp. 1191-1198, https://doi.org/10.1364/JOSAB.22.001191.

Jiang et al., "Global Optimization of Dielectric Metasurfaces Using a Physics-Driven Neural Network", Nano Letters, Jul. 11, 2019, vol. 19, No. 8, pp. 5366-5372, https://doi.org/10.1021/acs.nanolett.9b01857.

Jiang et al., "Low-dimensional nanomaterial saturable absorbers for ultrashort-pulsed waveguide lasers", Optical Materials Express, vol. 8, Issue 10, Oct. 1, 2018, first published Sep. 10, 2018, pp. 3055-3071, https://doi.org/10.1364/OME.8.003055.

Jiang et al., "Simulator-based training of generative neural networks for the inverse design of metasurfaces", Nanophotonics, vol. 9, Issue 5, 2019, published online Nov. 19, 2019, 11 pgs., DOI: https://doi.org/10.1515/nanoph-2019-0330.

Jiao et al., "A 70 dBohm 2.3 GHz low noise transimpedance amplifier", 2013 IEEE Third International Conference on Consumer Electronics ¿ Berlin (ICCE-Berlin), Sep. 9-11, 2013, pp. , DOI: 10.1109/ICCE-Berlin.2013.6697985.

Joy, "The spatial resolution limit of electron lithography", Microelectronic Engineering, vol. 1, Issue 2, Oct. 1983, pp. 103-119, https://doi.org/10.1016/0167-9317(83)90024-2.

Jutamulia, "Overview of hybrid optical neural networks", Science, vol. 28, 1996, pp. 59-72.

Kingma et al., "Adam: A Method for Stochastic Optimization", arXiv.org, Retrieved from: https://arxiv.org/abs/1412.6980v1 [cs.LG], Dec. 22, 2014, 9 pgs.

Koos et al., "Nonlinear silicon-on-insulator waveguides for all-optical signal processing", Optics Express, vol. 15, No. 10, May 14, 2007, first published May 1, 2007, pp. 5976-5990, doi: 10.1364/oe.15.005976.

Larger et al., "Photonic information processing beyond Turing: an optoelectronic implementation of reservoir computing", Optic Express, vol. 20, No. 3, Jan. 30, 2012 first published Jan. 27, 2012, pp. 3241-3249.

Lecun et al., "Deep learning", Nature, May 27, 2015, vol. 521, No. 7553, pp. 436-444, doi: 10.1038/nature14539.

Lecun et al., "Gradient-Based Learning Applied to Document Recognition", Proceedings of the IEEE, Nov. 1998, vol. 86, No. 11, pp. 2278-2324.

Li et al., "Reconfigurable controlled two-qubit operation on a quantum photonic chip", New Journal of Physics, vol. 13, 115009, Nov. 2011, 8 pgs., doi: 10.1088/1367-2630/13/11/115009.

Liebmann et al., "TCAD development for lithography resolution enhancement", IBM Journal of Research and Development, vol. 45, No. 5, Sep. 2001, pp. 651-665, DOI: 10.1147/rd.455.0651.

(56) References Cited

OTHER PUBLICATIONS

Marpaung et al., "Integrated microwave photonics", Laser & Photonic Reviews, vol. 7, Issue 4, Jul. 2013, pp. 506-538, first published Jan. 16, 2013, https://doi.org/10.1002/lpor.201200032.

Marty et al., "Advanced etching of silicon based on deep reactive ion etching for silicon high aspect ratio microstructures and three-dimensional micro- and nanostructures", Microelectronics Journal, vol. 36, Issue 7, Jul. 2005, pp. 673-677, https://doi.org/10.1016/j.mejo.2005.04.039.

Merolla et al., "A million spiking-neuron integrated circuit with a scalable communication network and interface", Science, Aug. 8, 2014, vol. 345, No. 6197, pp. 668-673, doi: 10.1126/science.1254642.

Metcalf et al., "Multiphoton quantum interference in a multiport integrated photonic device", Nature Communications, vol. 1, No. 1356, Jan. 15, 2013, pp. 1-7, DOI:10.1038/ncomms2349.

* cited by examiner

SYSTEMS AND METHODS FOR ACTIVATION FUNCTIONS FOR PHOTONIC NEURAL NETWORKS

CROSS-REFERENCE TO RELATED APPLICATIONS

The present application is a U.S. national phase of PCT Application No. PCT/US2019/031748 entitled "Systems and Methods for Activation Functions for Photonic Neural Networks", filed May 10, 2019, which claims the benefit of and priority to U.S. Provisional Patent Application No. 62/669,899 entitled "Training of Photonic Neural Networks Through in Situ Backpropagation", filed May 10, 2018 and to U.S. Provisional Patent Application No. 62/815,243 entitled "Systems and Methods for Activation Functions for Photonic Neural Networks", filed Mar. 7, 2019. The disclosure of PCT Application No. PCT/US2019/031748 and U.S. Provisional Patent Application Ser. Nos. 62/669,899 and 62/815,243 are herein incorporated by reference in their entireties.

STATEMENT OF FEDERALLY SPONSORED RESEARCH

This invention was made with Government support under contract FA9550-17-1-0002 awarded by the Air Force Office of Scientific Research. The Government has certain rights in the invention.

FIELD OF THE INVENTION

The present invention generally relates to photonic neural networks and more specifically relates to activation functions for forward and/or backward propagation through photonic neural networks.

BACKGROUND

Recently, integrated optics has gained interest as a hardware platform for implementing machine learning algorithms, including artificial neural networks (ANNs), which rely heavily on matrix-vector multiplications that may be done efficiently in photonic circuits. Artificial neural networks, and machine learning in general, are becoming ubiquitous for an impressively large number of applications. This has brought ANNs into the focus of research in not only computer science, but also electrical engineering, with hardware specifically suited to perform neural network operations actively being developed. There are significant efforts in constructing artificial neural network architectures using various electronic solid-state platforms, but ever since the conception of ANNs, a hardware implementation using optical signals has also been considered. Optical hardware platforms are particularly appealing for computing and signal processing due to their ultra-large signal bandwidths, low latencies, and reconfigurability. Photonic implementations benefit from the fact that, due to the non-interacting nature of photons, linear operations—like the repeated matrix multiplications found in every neural network algorithm—can be performed in parallel, and at a lower energy cost, when using light as opposed to electrons.

SUMMARY OF THE INVENTION

Systems and methods for activation in an optical circuit in accordance with embodiments of the invention are illustrated. One embodiment includes an optical activation circuit, wherein the circuit comprises a directional coupler, an optical-to-electrical conversion circuit, a time delay element, a nonlinear signal conditioner, and a phase shifter. The directional coupler receives an optical input and provides a first portion to the optical-to-electrical conversion circuit and a second portion to the time delay element, the time delay element provides a delayed signal to the phase shifter, and the optical-to-electrical conversion circuit converts an optical signal from the directional coupler to an electrical signal used to activate the phase shifter to shift the phase of the delayed signal.

In a further embodiment, the nonlinear signal conditioner performs a nonlinear transformation of a voltage from the optical-to-electrical conversion circuit.

In still another embodiment, the method further includes steps for an element to add a static bias voltage to the electrical signal used to activate the phase shifter.

In a still further embodiment, the phase shifter is embedded in an interferometer to modulate the intensity of the delayed signal.

In yet another embodiment, the interferometer is a Mach-Zehnder interferometer.

In a yet further embodiment, the optical-to-electrical conversion circuit includes a photodetector.

In another additional embodiment, the optical-to-electrical conversion circuit further includes a signal amplifier.

In a further additional embodiment, the signal amplifier is a semiconductor optical amplifier.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description and claims will be more fully understood with reference to the following figures and data graphs, which are presented as exemplary embodiments of the invention and should not be construed as a complete recitation of the scope of the invention.

DETAILED DESCRIPTION

Figure 1:
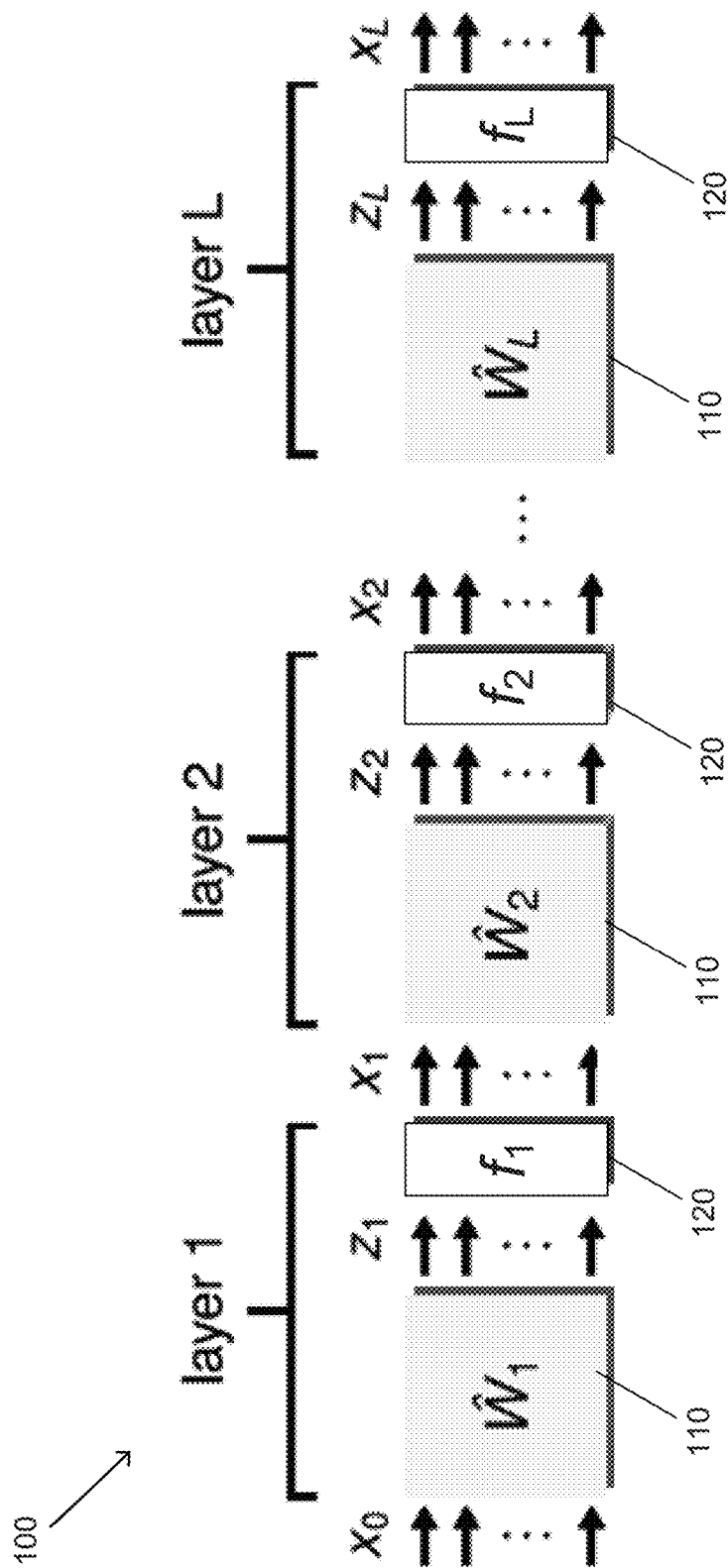
FIG. 1 illustrates a block diagram of a feedforward neural network (or a photonic hardware platform) of L layers in accordance with an embodiment of the invention.

Turning now to the drawings, systems and methods in accordance with certain embodiments of the invention can be used to train and implement photonic neural networks. Systems and methods in accordance with many embodiments of the invention provide an electro-optic hardware platform for nonlinear activation functions in optical neural networks. The optical-to-optical nonlinearity in accordance with many embodiments of the invention operates by converting a small portion of the input optical signal into an analog electric signal, which can be used to intensity-modulate the original optical signal with no reduction in operating speed. In some embodiments, this scheme can allow for complete nonlinear on-off contrast in transmission at relatively low optical power thresholds and can eliminate the requirement of having additional optical sources between each layer of the network. In numerous embodiments, the activation function is reconfigurable via electrical bias, allowing it to be programmed or trained to synthesize a variety of nonlinear responses. Activation functions in accordance with various embodiments of the invention can significantly improve the expressiveness of optical neural networks, allowing them to perform well on machine learning tasks. Although many of the examples described herein are described with reference to a particular hardware implementation of a photonic ANN, one skilled in the art will recognize that methods and systems can be readily applied to other photonic platforms without departing from the heart of the invention.

Nonlinear activation functions playa key role in ANNs by enabling them to learn complex mappings between their inputs and outputs. Whereas digital processors have the expressiveness to trivially apply nonlinearities such as the widely-used sigmoid, ReLU, and tan h functions, the realization of nonlinearities in optical hardware platforms is more challenging. One reason for this is that optical nonlinearities are relatively weak, necessitating a combination of large interaction lengths and high signal powers, which impose lower bounds on the physical footprint and the energy consumption, respectively. Although it is possible to resonantly enhance optical nonlinearities, this comes with an unavoidable trade-off in reducing the operating bandwidth, thereby limiting the information processing capacity of an ONN. Additionally, maintaining uniform resonant responses across many elements of an optical circuit necessitates additional control circuitry for carefully calibrating each element.

A more fundamental limitation of optical nonlinearities is that their responses tend to be fixed during device fabrication. This limited tunability of the nonlinear optical response prevents an ONN from being reprogrammed to realize different nonlinear activation functions, which may be more suitable for a given machine learning task. Similarly, a fixed nonlinear response may also limit the performance of very deep ONNs with many layers of activation functions when the optical signal power drops below the activation threshold due to loss in previous layers. The activation threshold corresponds to the point on activation transfer function where nonlinearity is strongest. For example, with optical saturable absorption from 2D materials in waveguides, the activation threshold is on the order of 1-10 mW, meaning that the strength in the nonlinearity of each subsequent layer will be successively weaker.

In light of these challenges, other methods have attempted to implement activation functions by detecting each optical signal, feeding them through a conventional digital computer to apply the nonlinearity, and then modulating new optical signals for the subsequent layer. Although such approaches benefit from the flexibility of digital signal processing, conventional processors have a limited number of input and output channels, which would prevent such approaches from scaling to very matrix dimensions and a large number of optical inputs. Moreover, digitally applied nonlinearities add latency from the analog-to-digital conversion process and constrain the computational speed of the neural network to the same GHz-scale clock rates which ONNs seek to overcome.

Systems and methods in accordance with some embodiments of the invention provide an electro-optic architecture for synthesizing optical-to-optical nonlinearities which alleviates the issues discussed above. In many embodiments, architectures can feature complete on-off contrast in signal transmission, a variety of nonlinear response curves, and a low activation threshold. Rather than using traditional optical nonlinearities, systems and methods in accordance with a variety of embodiments of the invention can operate by measuring a small portion of the incoming optical signal power and using electro-optic modulators to modulate the original optical signal, without any reduction in operating bandwidth or computational speed. Additionally, processes in accordance with certain embodiments of the invention can allow for the possibility of performing additional nonlinear transformations on the signal using analog electrical components. Many of the examples described herein focus on the application of the electro-optic architecture as an element-wise activation in a feedforward ONN, but one skilled in the art will recognize that the synthesis of low-threshold optical nonlinearlities could be of broader interest in a variety of applications and fields such as (but not limited to) optical computing and information processing.

An ANN (or feedforward neural network) is a function which accepts an input vector, $x_0$ and returns an output vector, $x_L$. Specifically, ANNs can perform several layers of transformations on their inputs, with each consisting of a linear matrix-vector multiplication followed by the application of an element-wise nonlinear function, or activation, on the result. Optical hardware implementations of ANNs have been proposed in various forms over the past few decades. In various embodiments, optical hardware implementations of an ANN implement linear operations using an integrated optical circuit. In numerous embodiments, the information being processed by the network, $x_i$, can be encoded into the modal amplitudes of the waveguides feeding the device. Matrix-vector multiplications in accordance with many embodiments of the invention can be accomplished using meshes of integrated optical interferometers. Training the network in accordance with numerous embodiments of the invention requires finding the optimal settings for the integrated optical phase shifters controlling the inteferometers, which may be found using an analytical model of the chip, or using in-situ backpropagation techniques.

A block diagram of a feedforward neural network 100 (or a photonic hardware platform) of L layers in accordance with an embodiment of the invention is illustrated in FIG. 1. This figure illustrates that each layer of neural network 100 consists of a $\hat{W}_i$ block 110 representing a linear matrix which multiplies vector inputs $x_{i-1}$. In some embodiments, each $\hat{W}_i$ block represents an optical interference unit (OIU) with a number of integrated phase shifters. In many embodiments integrated phase shifters can be used to control an OIU and train a network.

Each layer of neural network 100 in this example also includes an activation block ($f_i$) 120 that represents an element-wise nonlinear activation function operating on vectors $z_i$ to produce outputs $x_i$. For a layer with index i, containing a weight matrix $\hat{W}_i$ and activation function $f_i(\cdot)$, this operation can be described mathematically as $$x_i = f_i(\hat{W}_i \cdot x_{i-1}) \quad (1)$$

for i from 1 to L.

Before they are able to perform useful computations, ANNs must be trained to accomplish a given machine learning task. The training process is typically accomplished by minimizing the prediction error of the ANN on a set of training examples, which come in the form of input and target output pairs. For a given ANN, a loss function (or cost function) is defined over the target output and output predicted by the network. During training, this loss function is minimized with respect to tunable degrees of freedom, namely the elements of the weight matrix $\hat{W}_i$ within each layer.

Figure 2:
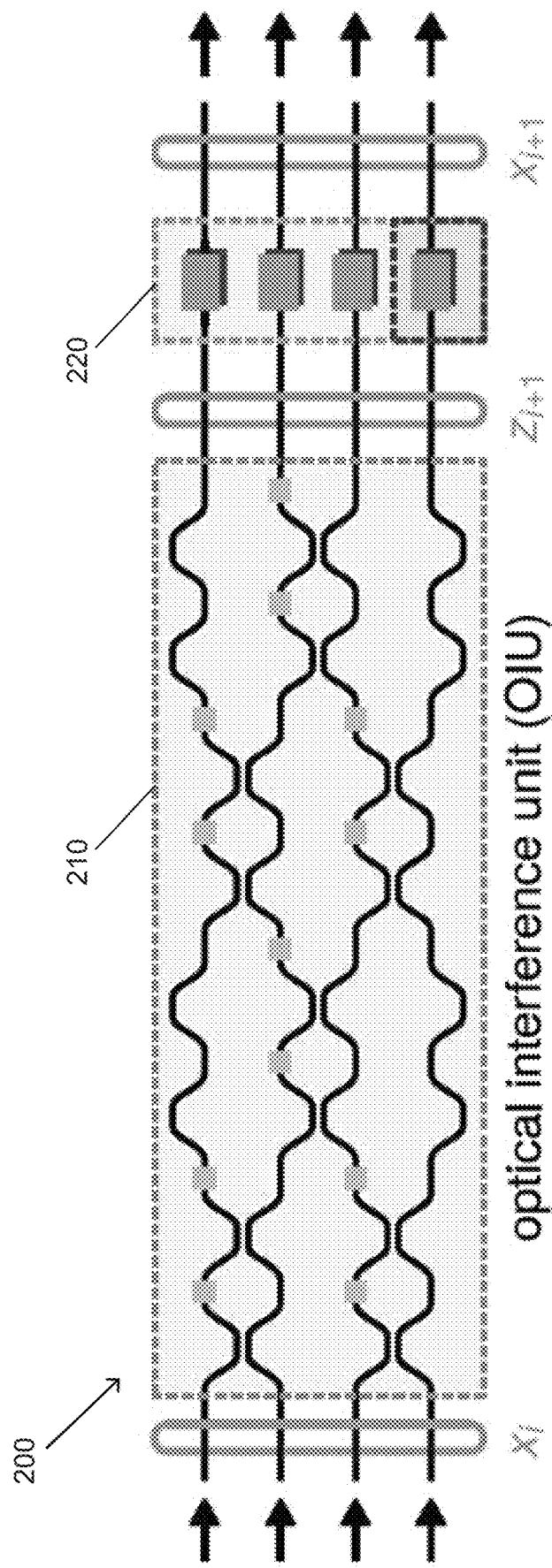
FIG. 2 illustrates an example of a single layer of a feedforward neural network in accordance with an embodiment of the invention.

An example of a single layer of a feedforward neural network in accordance with an embodiment of the invention is illustrated in FIG. 2. This figure shows a schematic of a layer 200 with a weight matrix block ($\hat{W}_i$) 210 and an activation block ($f_i$) 220. In this example, weight matrix block 210 performs linear operations using an optical interference unit (OIU). OIUs in accordance with certain embodiments of the invention are a mesh of controllable Mach-Zehnder interferometers (MZIs) integrated in a silicon photonic circuit. By tuning the phase shifters integrated in the MZIs, any unitary N×N operation on the input can be implemented, which finds applications both in classical and quantum photonics. In photonic ANNs in accordance with some embodiments of the invention, OIUs can be used for each linear matrix-vector multiplication. In certain embodiments, nonlinear activations can be performed using an electronic circuit, which involves measuring the optical state before activation, performing the nonlinear activation function on an electronic circuit such as a digital computer, and preparing the resulting optical state to be injected to the next stage of the ANN.

In the description of this example, the OIU is described by a number, N, of single-mode waveguide input ports coupled to the same number of single-mode output ports through a linear and lossless device. In certain embodiments, the device may also be extended to operate on differing numbers of inputs and outputs. OIUs in accordance with some embodiments of the invention implement directional propagation such that all power flows exclusively from the input ports to the output ports. In its most general form, devices implement the linear operation $$\hat{W} X_{in} = Z_{out}, \quad (2)$$

where $X_{in}$ and $Z_{out}$ are the modal amplitudes at the input and output ports, respectively, and $\hat{W}$, or the transfer matrix, is the off-diagonal block of the system's full scattering matrix, $$\begin{pmatrix} X_{out} \\ Z_{out} \end{pmatrix} = \begin{pmatrix} 0 & \hat{W}^T \\ \hat{W} & 0 \end{pmatrix} \begin{pmatrix} X_{in} \\ Z_{in} \end{pmatrix}. \quad (3)$$

The diagonal blocks are zero because forward-only propagation is assumed, while the off-diagonal blocks are the transpose of each other because a reciprocal system is assumed. $Z_{in}$ and $X_{out}$ correspond to the input and output modal amplitudes, respectively, if the device were run in reverse, i.e., sending a signal in from the output ports.

Nonlinear Activation Function

Systems and methods in accordance with some embodiments of the invention provide a nonlinear activation function architecture for optical neural networks. Nonlinear activation functions in accordance with numerous embodiments of the invention can implement an optical-to-optical nonlinearity by converting a small portion of the optical input power into an electrical voltage. The remaining portion of the original optical signal can be phase modulated by this voltage as it passes through an interferometer. In numerous embodiments, the resulting nonlinear optical activation function, $f(z)$, of the input signal amplitude, z, is a result of an interferometer intensity modulation response as well as the components in the electrical signal pathway.

Figure 3:
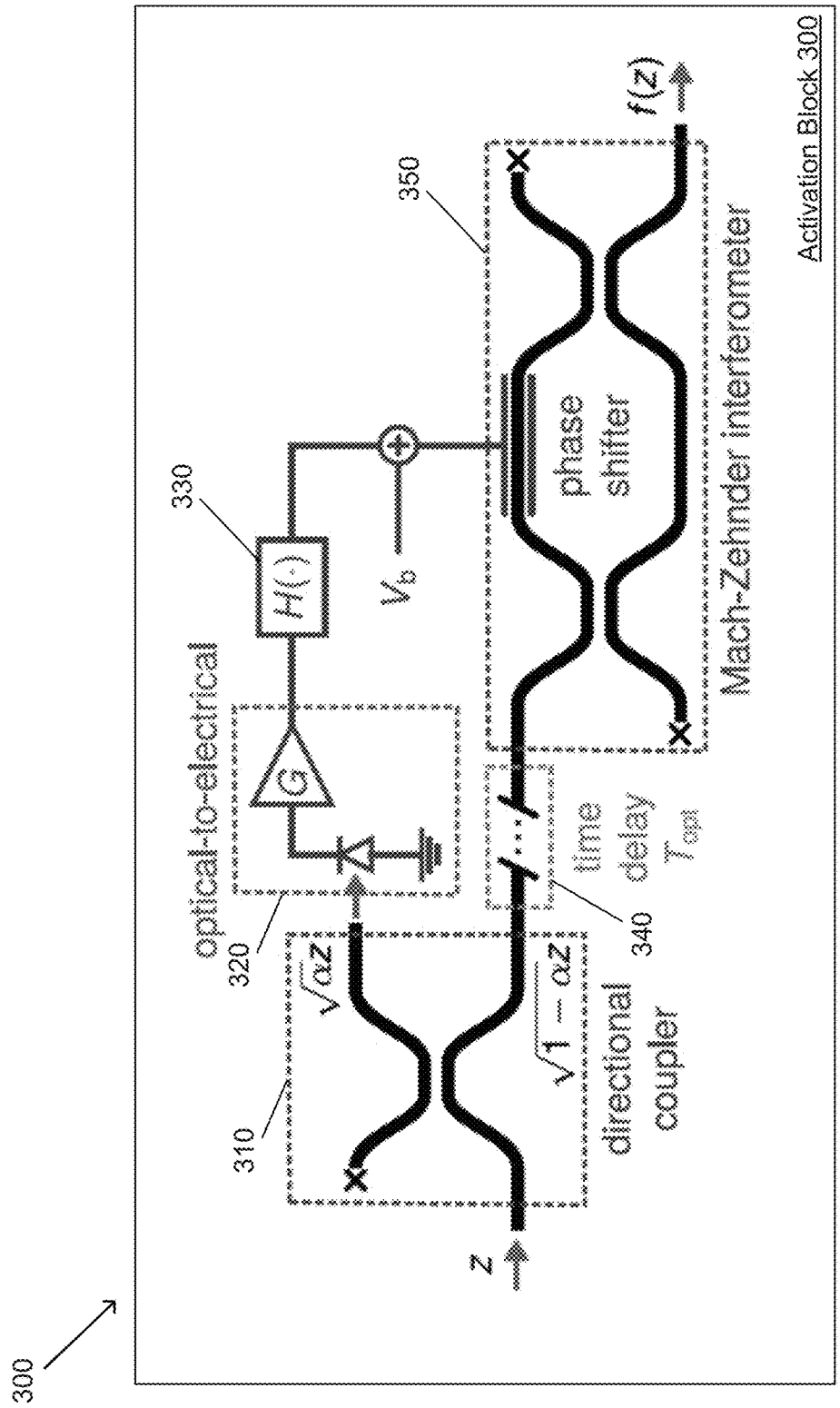
FIG. 3 illustrates an example of an activation block in accordance with an embodiment of the invention.

A more detailed example of an activation block ($f_i$) is illustrated in FIG. 3. Activation block 300 includes a directional coupler 310, optical-to-electrical conversion circuit 320, a nonlinear signal conditioner 330, time delay 340, and an interferometer 350. This figure shows a proposed optical-to-optical activation function in accordance with an embodiment of the invention which achieves a nonlinear response by converting a small portion of the optical input, z into an electrical signal, and then intensity modulating the remaining portion of the original optical signal as it passes through an interferometer.

In FIG. 3, thick black lines represents optical waveguides, while thinner blue lines represent electrical signal pathways. The input signal z first enters a directional coupler 310 which routes a portion of the input optical power, a, to a photodetector of optical-to-electrical conversion circuit 320. The photodetector is the first element of an optical-to-electrical conversion circuit 320, which is a standard component of high-speed optical receivers for converting an optical intensity into a voltage. In some embodiments, the optical-to-electrical conversion circuit also amplifies the optical intensity, such as (but not limited to) via a semiconductor optical amplifier (SOA) before the photodiode. In many embodiments, a transimpedance amplifier can be used to convert an output photocurrent to a voltage that can actuate a phase shifter, but optical amplification could alleviate the requirement of very high gain within the electrical domain. In certain embodiments, the required gain can be further reduced by utilizing an electro-optic phase shifter with a low threshold voltage to induce a phase shift in a phase modulator ($V_\pi$). In this example, a normalization of the optical signal is assumed, such that the total power in the input signal is given by $|z|^2$. The optical-to-electrical conversion process in accordance with certain embodiments of the invention consists of a photodetector producing an electrical current, $1_{pd} = \Re \cdot \alpha |z|^2$, where $\Re$ is the photodetector responsivity. A transimpedance amplifying stage, characterized by a gain G, converts this current into a voltage $V_G = G \cdot \Re \cdot \alpha |z|^2$. The output voltage of the optical-to-electrical conversion circuit then passes through a nonlinear signal conditioner 330 with a transfer function, $H(\cdot)$. In certain embodiments, this component allows for the application of additional nonlinear functions to transform the voltage signal. Finally, the conditioned voltage signal, $H(V_G)$ can be added to with a static bias voltage, $V_b$ to induce a phase shift of $$\Delta\phi = \frac{\pi}{V_\pi}[V_b + H(G\Re \; \alpha|z|^2)] \quad (4)$$

for the optical signal routed through the lower port of the directional coupler 310. The parameter $V_\pi$ represents the voltage required to induce a phase shift of $\pi$ in the phase modulator. This phase shift is a nonlinear self-phase modulation because it depends on the input signal intensity.

In this example, an optical delay line 340 between the directional coupler and the Mach-Zehnder interferometer (MZI) 350 is used to match the signal propagation delays in the optical and electrical pathways. In various embodiments, optical delay lines can ensure that the nonlinear self-phase modulation is applied at the same time that the optical signal which generated it passes through the phase modulator. In this example, the optical delay is $\tau_{opt}=\tau_{oe}+\tau_{nl}+\tau_{rc}$, accounting for the contribution from the group delay of the optical-to-electrical conversion stage ($\tau_{oe}$), the delay associated with the nonlinear signal conditioner ($\tau_{nl}$), and the RC time constant of the phase modulator ($\tau_{rc}$).

In a number of embodiments, the nonlinear self-phase modulation achieved by the electric circuit can be converted into a nonlinear amplitude response by a MZI, which has a transmission depending on $\Delta\phi$ as $$t_{MZI} = j\exp\left(-j\frac{\Delta\phi}{2}\right)\cos\left(\frac{\Delta\phi}{2}\right). \quad (5)$$

Depending on the configuration of the bias, $V_b$, a larger input optical signal amplitude can cause either more or less power to be diverted away from the output port, resulting in a nonlinear self-intensity modulation. Combining the expression for the nonlinear self-phase modulation with the MZI transmission, the mathematical form of the activation function can be written explicitly as $$f(z) = j\sqrt{1-\alpha}\exp\left(-j\frac{1}{2}\left[\phi_b + \pi\frac{H(G\Re\alpha|z|^2)}{V_\pi}\right]\right) \cdot \cos \quad (6)$$

$$\left(\frac{1}{2}\left[\phi_b + \pi\frac{H(G\Re\alpha|z|^2)}{V_\pi}\right]\right)z,$$

where the contribution to the phase shift from the bias voltage is $$\phi_b = \pi\frac{V_b}{V_\pi}. \quad (7)$$

In some of the descriptions below, no nonlinear signal conditioning is applied to the electrical signal pathway. i.e. $H(V_G)=V_G$. However, even with this simplification the activation function still exhibits a highly nonlinear response. Saturating effects in the OE conversion stage, which can occur in either the photodetector or the amplifier, are also neglected. However, in practice these saturating effects could be taken advantage of to modify the optical-to-optical transfer function in accordance with numerous embodiments of the invention.

With the above simplifications, a more compact expression for the activation function response is $$f(z) = j\sqrt{1-\alpha}\exp\left(-j\left[\frac{g_\phi|z|^2}{2} + \frac{\phi_b}{2}\right]\right) \cdot \cos\left(\frac{g_\phi|z|^2}{2} + \frac{\phi_b}{2}\right)z, \quad (8)$$

where the phase gain parameter is defined as $$g_\phi = \pi\frac{\alpha G\Re}{V_\pi}. \quad (9)$$

This equation indicates that the amount of phase shift per unit input signal power can be increased via the gain and photodiode responsivity, or by converting a larger fraction of the optical power to the electrical domain. However, tapping out a larger fraction optical power also results in a larger linear loss, which provides no benefit to the nonlinearity.

Figure 4:
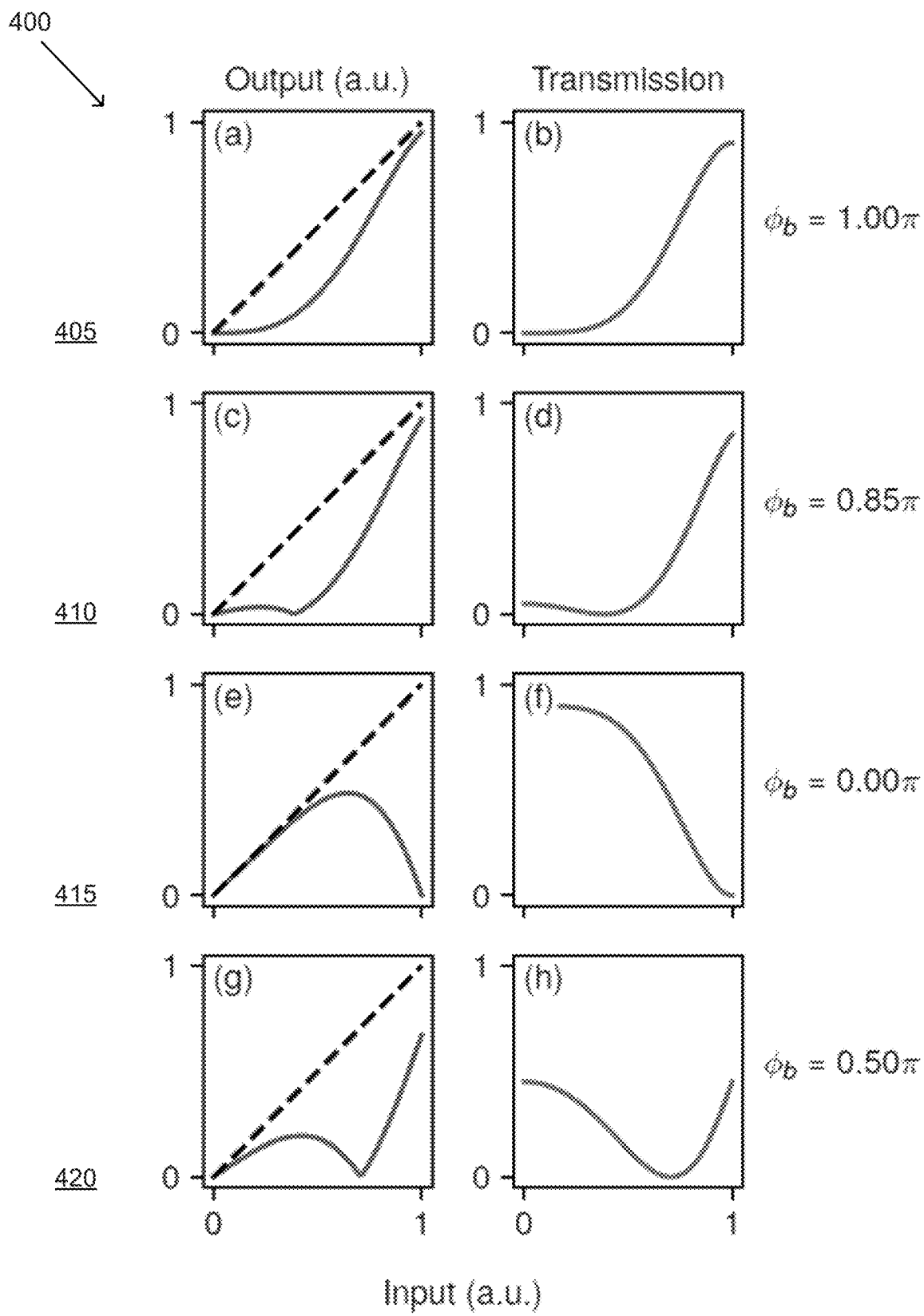
FIG. 4 illustrates responses across a representative selection of electrical biasing in accordance with an embodiment of the invention.

In many embodiments, the electrical biasing of the activation phase shifter, represented by $V_b$, is an important degree of freedom for determining its nonlinear response. A representative selection of electrical biasing is considered in the example illustrated in FIG. 4. The left column of FIG. 4 plots the output signal amplitude as a function of the input signal amplitude i.e. $|f(x)|$ in Eq. 8, while the right column plots the transmission coefficient i.e. $|f(x)|^2/|x|^2$, a quantity which is more commonly used in optics than machine teaming. The first two rows 405 and 410, corresponding to $\phi_b=1.0\pi$ and $0.85\pi$, exhibit a response which is comparable to the ReLU activation function: transmission is low for small input values and high for large input values. For the bias of $\phi_b=0.85\pi$ in the second row 410, transmission at low input values is slightly increased with respect to the response where $\phi_b=1.00\pi$. Unlike the ideal ReLU response, the activation at $\phi_b=0.85\pi$ is not entirely monotonic because transmission first goes to zero before increasing. On the other hand, the responses shown in the bottom two rows 415 and 420, corresponding to $\phi_b=0.0\pi$ and $0.50\pi$, are quite different. These configurations demonstrate a saturating response in which the output is suppressed for higher input values but enhanced for lower input values. Rows 415 and 420 correspond to a clipped response, with high transmission for inputs with small amplitude and reduced transmission for inputs with larger amplitude. All of the responses shown in this figure have assumed $\alpha=0.1$, which limits the maximum transmission to $1-\alpha=0.9$.

In a variety of embodiments, by having electrical control over the activation response, its electrical bias can be connected to the same control circuitry which programs the linear interferometer meshes. In doing so, a single ONN hardware unit in accordance with a number of embodiments of the invention can be reprogrammed to synthesize many different activation function responses. In certain embodiments, an activation function response can be heuristically selected. Activation biases in accordance with several embodiments of the invention can be directly optimized using a training algorithm. This realization of a flexible optical-to-optical nonlinearity can allow ONNs to be applied to much broader classes of machine learning tasks.

FIG. 4 shows only the amplitude response of the activation function. In fact, all of these responses also introduce a nonlinear self phase modulation to the output signal. In a number of embodiments, this nonlinear self-phase modulation can be suppressed using a push-pull interferometer configuration in which the generated phase shift. $\Delta\phi$, is divided and applied with opposite sign to the top and bottom arms.

Computational Performance

Power consumption, computational latency, and speed need to scale for an integrated ONN, which uses meshes of integrated optical interferometers to perform matrix-vector multiplications and the electro-optic activation function, with respect to the number of network layers, L and the input data dimension, N.

The power consumption of an ONN in accordance with various embodiments of the invention consists of contributions from (1) the programmable phase shifters inside the interferometer mesh, (2) the optical source supplying the input vectors, $x_0$, and (3) the active components of the activation function such as the amplifier and photodetector. Of these, the contributions of (2) and (3) pertain to the activation function.

Figure 5:
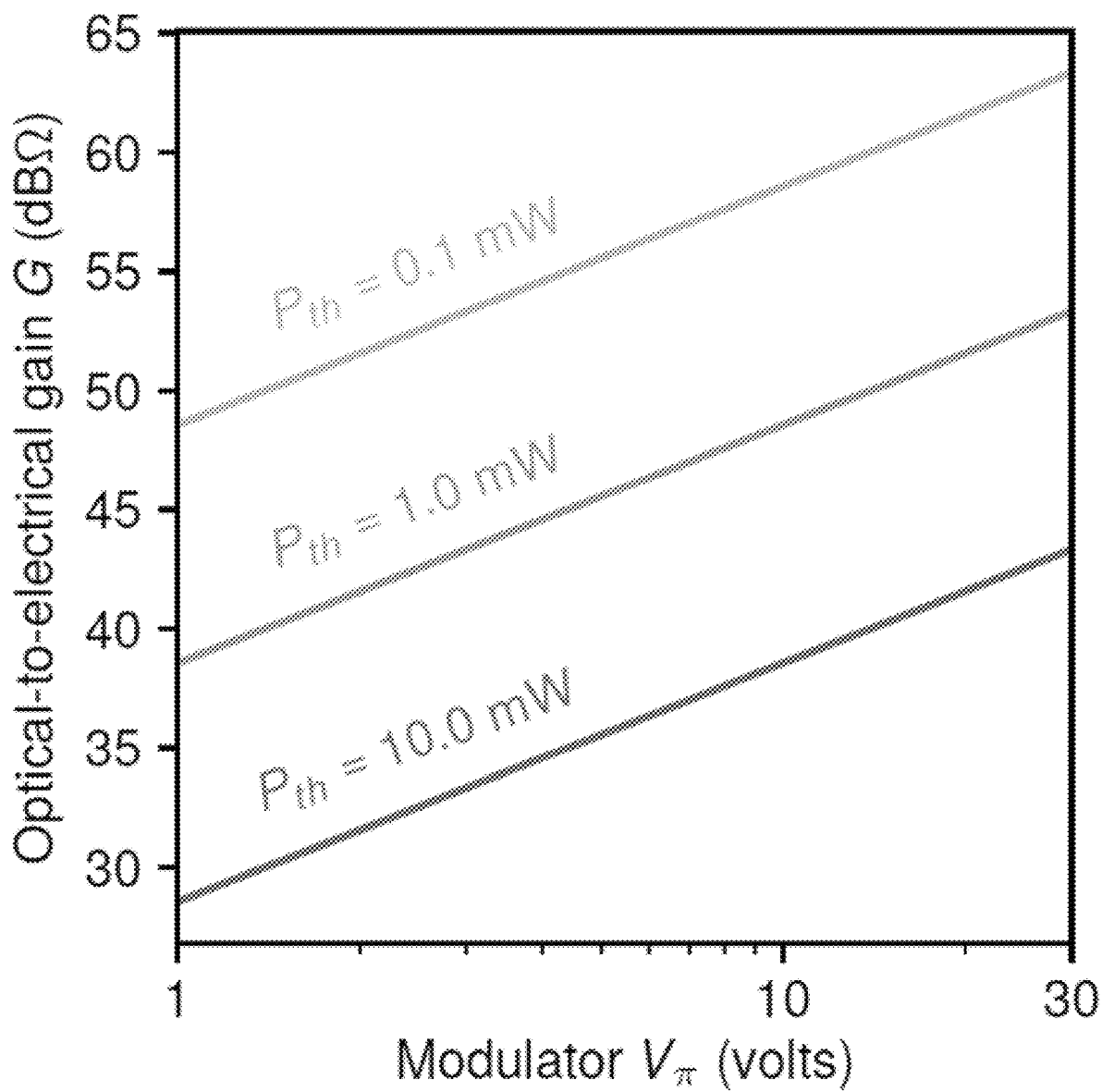
FIG. 5 illustrates a chart of the relationship between optical-to-electrical gain G and the modulator $V_\pi$ for various activation thresholds.

To quantify the power consumption, consider the minimum input optical power to a single activation that triggers a nonlinear response, or the activation function threshold. The activation function threshold can be mathematically defined as $$P_{th} = \frac{\Delta\phi \, |_{\delta T=0.5}}{g_\phi} = \frac{V_\pi}{\pi \alpha G \mathfrak{R}} \cdot \Delta\phi \, |_{\delta T=0.5}, \quad (10)$$

where $\Delta\phi|_{\delta T=0.5}$ is the phase shift necessary to generate a 50% change in the power transmission with respect to the transmission with null input for a given $\phi_b$. In general, a lower activation threshold will result in a lower optical power required at the ONN input, $|x_0|^2$. Equation 10 indicates that the activation threshold can be reduced via a small $V_\pi$ and a large optical-to-electrical conversion gain, $G\mathfrak{R}$. A chart of the relationship between optical-to-electrical gain G and the modulator $V_\pi$ for activation thresholds of 0.1 mW, 1.0 mW, and 10.0 mW is shown in FIG. 5 for a fixed photodetector responsivity $\mathfrak{R}=1$ A/W. Additionally, FIG. 5 makes a conservative assumption that $\phi_b=\pi$, which has the highest threshold of the activation function bases shown in FIG. 4.

Using the lowest activation threshold of 0.1 mW in FIG. 5, the optical source to the ONN would then need to supply $N \cdot 0.1$ mW of optical power. The power consumption of integrated optical receiver amplifiers varies considerably, ranging from as low as 10 mW to as high as 150 mW, depending on a variety of factors. A conservative estimate of the power consumption from a single optical-to-electrical conversion circuit is $L \cdot N \cdot 100$ mW. For an ONN with N=100, the power consumption per layer from the activation function would be 10 W and would require a total optical input power of $N \cdot P_{th} = 100 \cdot 0.1$ mW = 10 mW. Reducing the optical signal power level in accordance with several embodiments of the invention has the added advantage that it can mitigate the undesired effects of concentrated high-power regions within the interferometer mesh where many optical signals constructively interfere.

For a feedforward neural network architecture, latency can be defined by the elapsed time between supplying an input vector, $x_0$ and reading out its corresponding prediction vector, $x_L$. In an integrated ONN, this delay can simply be the travel time for an optical pulse through all L-layers. In some embodiments, the propagation distance in the interferometer mesh is $D_W = N \cdot D_{MZI}$, where $D_{MZI}$ is the length of each MZI within the mesh. In the nonlinear activation layer, the propagation length can be dominated by the delay line required to match the optical and electrical delays, and is given by $$D_f = (\tau_{oe} + \tau_{nl} + \tau_{re}) \cdot v_g, \quad (11)$$

where the group velocity $v_g = c_0/n_{eff}$ is the speed of optical pulses in the waveguide. Therefore, the mathematical expression for the latency is $$\text{latency} = \underbrace{L \cdot N \cdot D_{MZI} \cdot v_g^{-1}}_{\text{Interferometer mesh}} + \underbrace{L \cdot (\tau_{oe} + \tau_{nl} + \tau_{re})}_{\text{Activation function}}. \quad (12)$$

This indicates that the latency contribution from the interferometer mesh scales with the product LN. On the other hand, the activation function adds to the latency independently of N because each circuit is applied in parallel to all vector elements.

For concreteness, assume $D_{MZI}=100$ μm and $n_{eff}=3.5$. Assuming that no nonlinear electrical signal conditioner is used in the activation function, $\tau_{nl}=0$ ps. Typical group delays for integrated transimpedance amplifiers used in optical receivers can range from $\tau_{oe} \approx 10$ to 100 ps. Moreover, assuming an RC-limited phase modulator speed of 50 GHz yields $\tau_{re} \approx 20$ ps. Therefore, assuming a conservative value of $\tau_{oe}=100$ ps, a network dimension of $N \approx 100$ would have a latency of 237 ps per layer, with equal contributions from the mesh and the activation function. For a ten layer network (L=10) the total latency would be $\approx 2.4$ ns, still orders of magnitude lower than the latency typically associated with GPUs.

The speed, or computational capacity, of an ONN can be determined by the number of input vectors, $x_0$ which can be processed per unit time. Although activation functions in accordance with some embodiments of the invention are not fully optical, there is no speed degradation compared to a linear ONN consisting of only interferometer meshes. The reason for this is that a fully integrated ONN would also include high-speed modulators and detectors on-chip to perform fast modulation and detection of sequences of $x_0$ vectors and $x_L$ vectors, respectively. In a number of embodiments, the same high-speed detector and modulator elements could also be integrated between the linear network layers to provide the optical-electrical and electrical-optical transduction for the activation function. Similarly, the transimpedance amplifier and any other electronic components could be co-integrated with the photonic components in accordance with several embodiments of the invention. State of the art integrated transimpedance amplifiers can already operate at speeds comparable to the optical modulator and detector rates, which are on the order of 50-100 GHz, and thus would not be limiting factor, assuming a conservative photodetector and modulator rate of 10 GHz results in an effective speed which scales as $0.01 N_2 L$ TFLOPS. Thus, a one layer ONN with N=10 would perform at 1 TFLOPS, while increasing the number of inputs to N=100 would result in a performance of 100 TFLOPS, orders of magnitude greater than the peak performance obtainable with modern GPUs.

Activation function circuits in accordance with various embodiments of the invention can be modified to remove the matched optical delay line. This modification may be advantageous for reducing the footprint of the activation and would result in $\tau_{opt} \ll \tau_{ele}$. However, this can result in a reduction of the ONN speed, which would then be limited by the combined activation delay of all L nonlinear layers in the network, $\sim(L \cdot \tau_{ele})^{-1}$.

In this section, the self-phase modulation response of the electro-optic activation function is compared to an all-optical self-phase modulation achieved with the Kerr effect. The Kerr effect is a third-order optical nonlinearity which yields a change in the refractive index proportional to the local intensity. Unlike the self-phase modulation in the electro-optic activation function, the Kerr effect is lossless and has no latency. The strength of the Kerr effect inside a waveguide can be quantified through the amount of nonlinear phase shift it generates per unit input power per unit length. Mathematically, this figure of merit is defined as $$\Gamma_{Kerr} = \frac{2\pi}{\lambda_0} \frac{n_2}{A}, \quad (13)$$

where $n_2$ is the nonlinear refractive index of the material and A is the effective mode area. Values of $\Gamma_{Kerr}$ range from 100 $(W \cdot m)^{-1}$ in chalcogenide to 350 $(W \cdot m)^{-1}$ in silicon. For comparison, an equivalent figure of merit for the electro-optic feedforward scheme can be mathematically defined as $$\Gamma_{EO} = \pi \frac{\alpha \, \Re \, G}{V_\pi L}, \quad (14)$$

where $V_\pi L$ is the phase modulator figure of merit. A comparison of Eq. 13 and Eq. 14 indicates that while the strength of the Kerr effect is largely fixed by waveguide design and material choice, the electro-optic scheme has several degrees of freedom which allow it to potentially achieve a stronger nonlinear response.

The first design parameter is the amount of power tapped off to the photodetector, which can be increased to generate a larger voltage at the phase modulator. However, increasing $\alpha$ also increases the linear signal loss through the activation which does not contribute to the nonlinear mapping between the input and output of the ONN. Therefore, $\alpha$ should be minimized such that the optical power routed to the photodetector is large enough to be above the noise equivalent power level.

Figure 6:
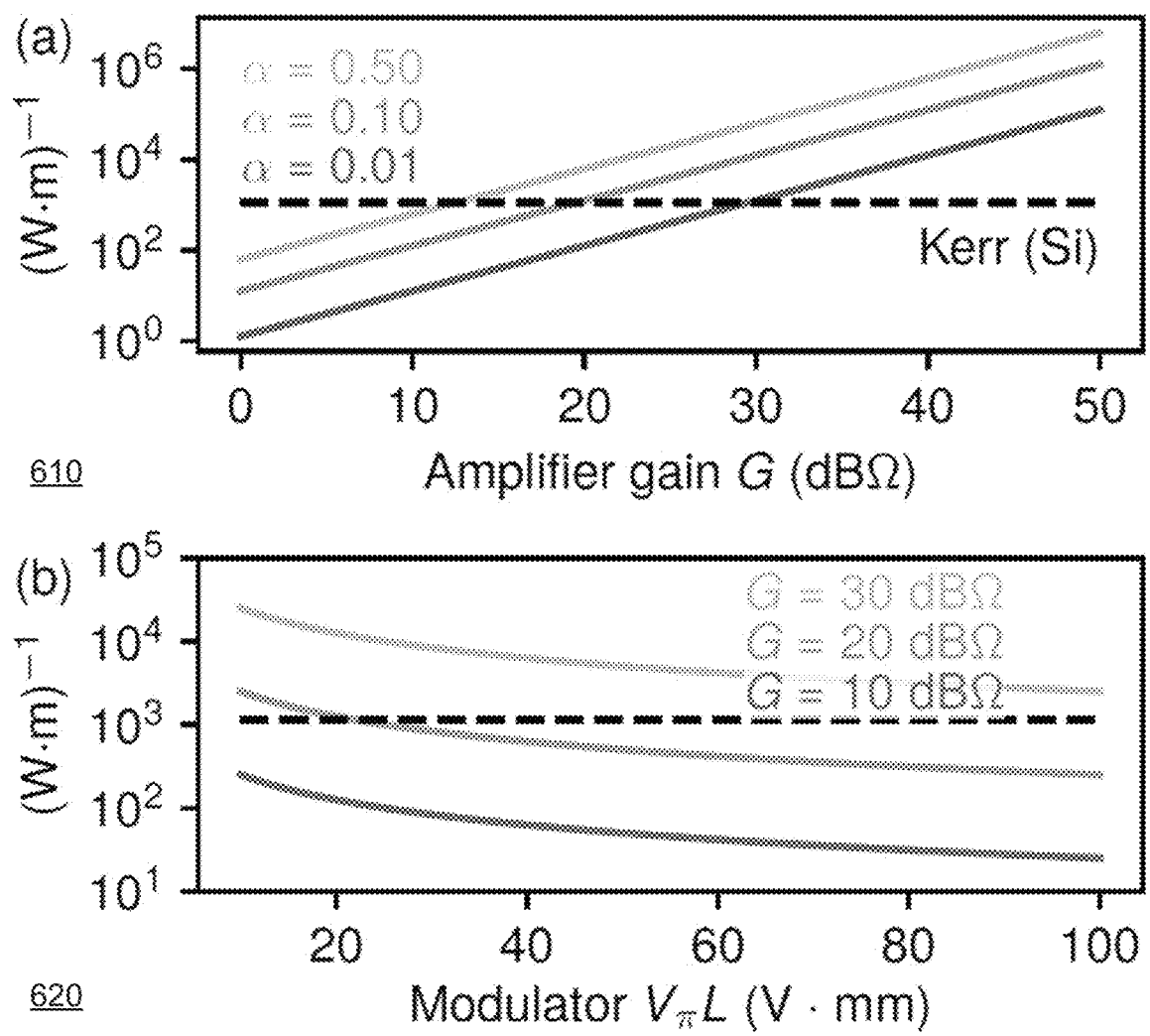
FIG. 6 illustrates charts of a nonlinear parameter for the electro-optic activation as a function of gain and modulator.

On the other hand, the product $\Re G$ determines the conversion efficiency of the detected optical power into an electrical voltage. Charts of nonlinear parameter $\Gamma_{EO}$ for the electro-optic activation as a function of gain and modulator are illustrated in FIG. 6. The first chart 610 of FIG. 6 compares $\Gamma_{EO}$ 612 to $\Gamma_{Kerr}$ from silicon 614 for $\alpha$=0.50, 0.10, and 0.01, as a function of G. The responsivity is fixed at $\Re$=1.0 A/W. Tapping out 10% of the optical power requires a gain of 20 dB$\Omega$ to achieve a nonlinear phase shift equivalent to that of a silicon waveguide where A=0.05 $\mu m^2$ for the same amount of input power. Tapping out only 1% of the optical power requires an additional 10 dB$\Omega$ of gain to maintain equivalence. The gain range considered in the first chart 610 is well within the regime of what has been demonstrated in integrated transimpedance amplifiers for optical receivers. In fact, many of these systems have demonstrated much higher gain. In the first chart 610, the phase modulator $V_\pi L$ was fixed at 20 V·mm. However, because a lower $V_\pi L$ translates into an increased phase shift for an applied voltage, this parameter can also be used to enhance the nonlinearity in accordance with some embodiments of the invention. The second chart 620 demonstrates the effect of changing the $V_\pi L$ for several values of of G, again, with a fixed responsivity $\Re$=1.0 A/W. This demonstrates that with a reasonable level of gain and phase modulator performance, the electro-optic activation function can trade off an increase in latency for a significantly lower optical activation threshold than the Kerr effect.

Examples

In this section, electro-optic activation functions in accordance with several embodiments of the invention are applied to example machine earning tasks, including an exclusive-OR (XOR) function and handwritten number classification.

An exclusive-OR (XOR) is a logic function which takes two inputs and produces a single output. The output is high if only one of the two inputs is high, and low for all other possible input combinations. In this example, a multi-input XOR takes N input values, given by $x_1 \ldots x_N$, and produces a single output value, y. The input-output relationship of the multi-input XOR function is a generalization of the two-input XOR. For example, defining logical high and low values as 1 and 0, respectively, a four-input XOR would have x=[1 0 0 0]→y=1 and x=[1 1 0 0]→y=0. The XOR function requires a non-trivial level of nonlinearity, meaning that it could not be implemented in an ONN consisting of only linear interferometer meshes.

In this example, the ONN includes L layers, with each layer constructed from an N×N unitary interferometer mesh followed by an array of N parallel electro-optic activation functions. After the final layer, the lower N−1 outputs are dropped to produce a single output value which corresponds to y. Unlike the ideal XOR input-output relationship described above, for the XOR task learned by the ONN, the input vectors are normalized such that they always have an $L_2$ norm of 1. This constraint is equivalent to enforcing a constant input power to the network. Additionally, because the activation function causes the optical power level to be attenuated at each layer, the high output state is normalized to be a value of 0.2. The low output value remains fixed at a value of 0.0. In several embodiments, additional ports are added with fixed power biases to increase the total input power to the network.

Figure 7:
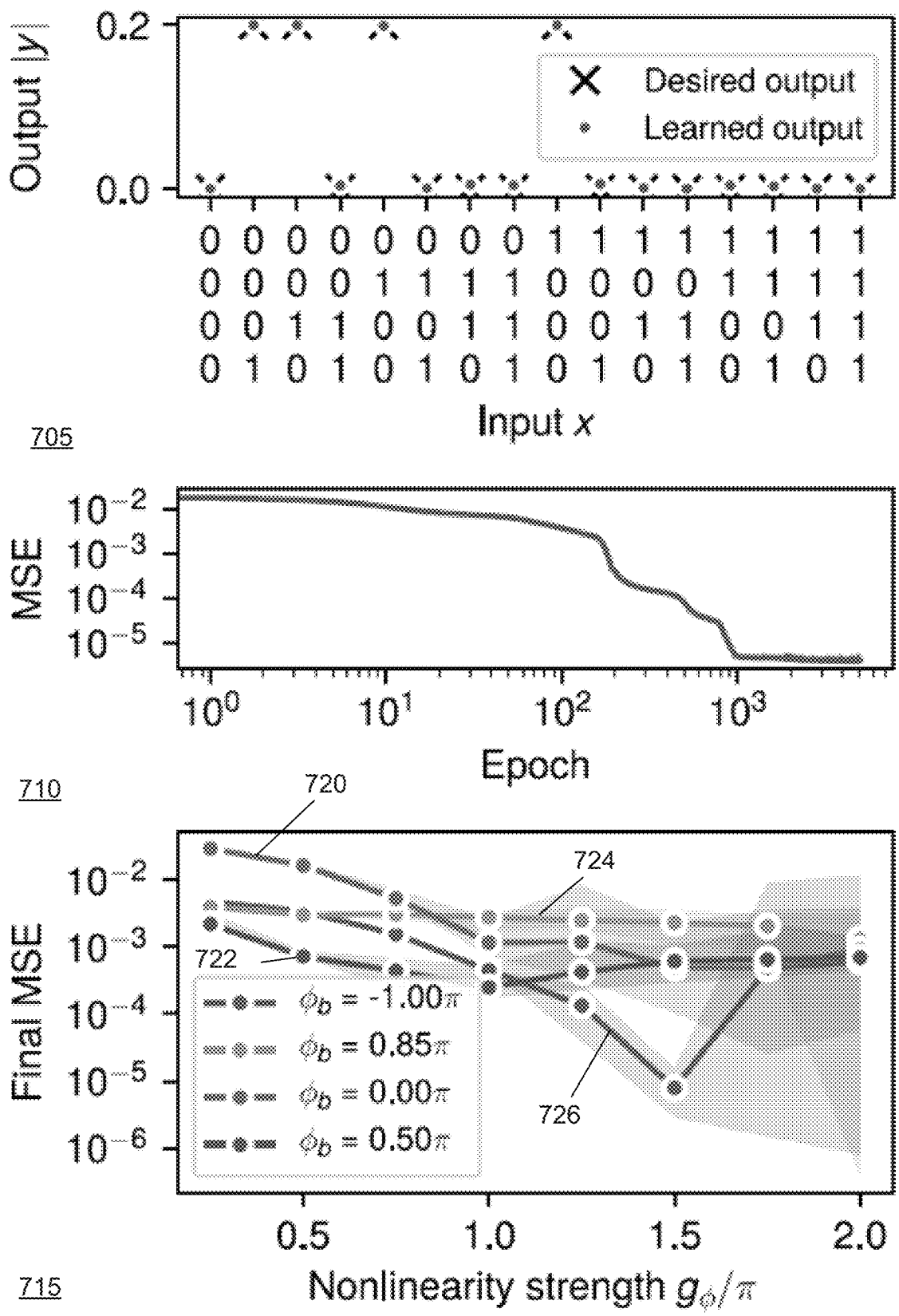
FIG. 7 illustrates charts of an XOR example.

Charts of an XOR example are illustrated in FIG. 7. The first chart 705 of FIG. 7 illustrates the four-input XOR input-output relationship which was learned by a two-layer ONN. In this example, the electro-optic activation functions were configured to have a gain of g=1.75$\pi$ and biasing phase of $\phi_b = \pi$. This biasing phase configuration corresponds to a ReLU-like response described above. The black markers (X) indicate the desired output values while the red circles indicate the output learned by the two-layer ONN. The first chart 705 indicates excellent agreement between the learned output and the desired output. The evolution of the mean squared error (MSE) between the ONN output and the desired output during training confirms this agreement, as shown in the second chart 710, with a final MSE below $10^{-5}$.

To train the ONN, a total of $2^N$=16 training examples were used, corresponding to all possible binary input combinations along the x-axis of the first chart 705. All 16 training examples were fed through the network in a batch to calculate the mean squared error (MSE) loss function. The gradient of the loss function with respect to each phase shifter was computed by backpropagating the error signal through the network to calculate the loss sensitivity at each phase shifter. The above steps were repeated until the MSE converged, as shown in the second chart 710.

To demonstrate that the nonlinearity provided by the electro-optic activation function is essential for the ONN to successfully learn the XOR, the third chart 715 plots the final MSE after 5000 training epochs, averaged over 20 independent training runs, as a function of the activation function gain, $g_\phi$. The shaded regions indicate the minimum and maximum range of the final MSE over the 20 training runs.

The blue curve 726 in the third chart 715, which corresponds to the ReLU-like activation, shows a clear improvement in the final MSE with an increase in the nonlinearity strength. For very high nonlinearity, above $g_\phi=1.5\pi$, the range between the minimum and maximum final MSE broadens and the mean final MSE increases. However, the best case (minimum) final MSE continues to decrease, as indicated by the lower border of the shaded blue region. This trend indicates that although increasing nonlinearity allows the ONN to better learn the XOR function, very high levels of nonlinearity may also cause convergence issues in training algorithm.

A trend of decreasing MSE with increasing nonlinearity is also observed for the activation corresponding to the green curve 720 in the third chart 715. However, the range of MSE values begins to broaden at a lower value of $g_\phi=1.0\pi$. Such broadening may be a result of the changing slope in the activation function output. For some of the activation functions corresponding to the red (722) and orange (724) curves in the third chart 715, the final MSE decreases somewhat with an increase in $g_\phi$, but generally remains much higher than the other two activation function responses.

In another example, the activation function is used to classify images of handwritten digits from the MNIST dataset, which has become a standard benchmark problem for ANNs. The dataset consists of 70,000 grayscale 28×28 pixel images of handwritten digits between 0 and 9.

Figure 8:
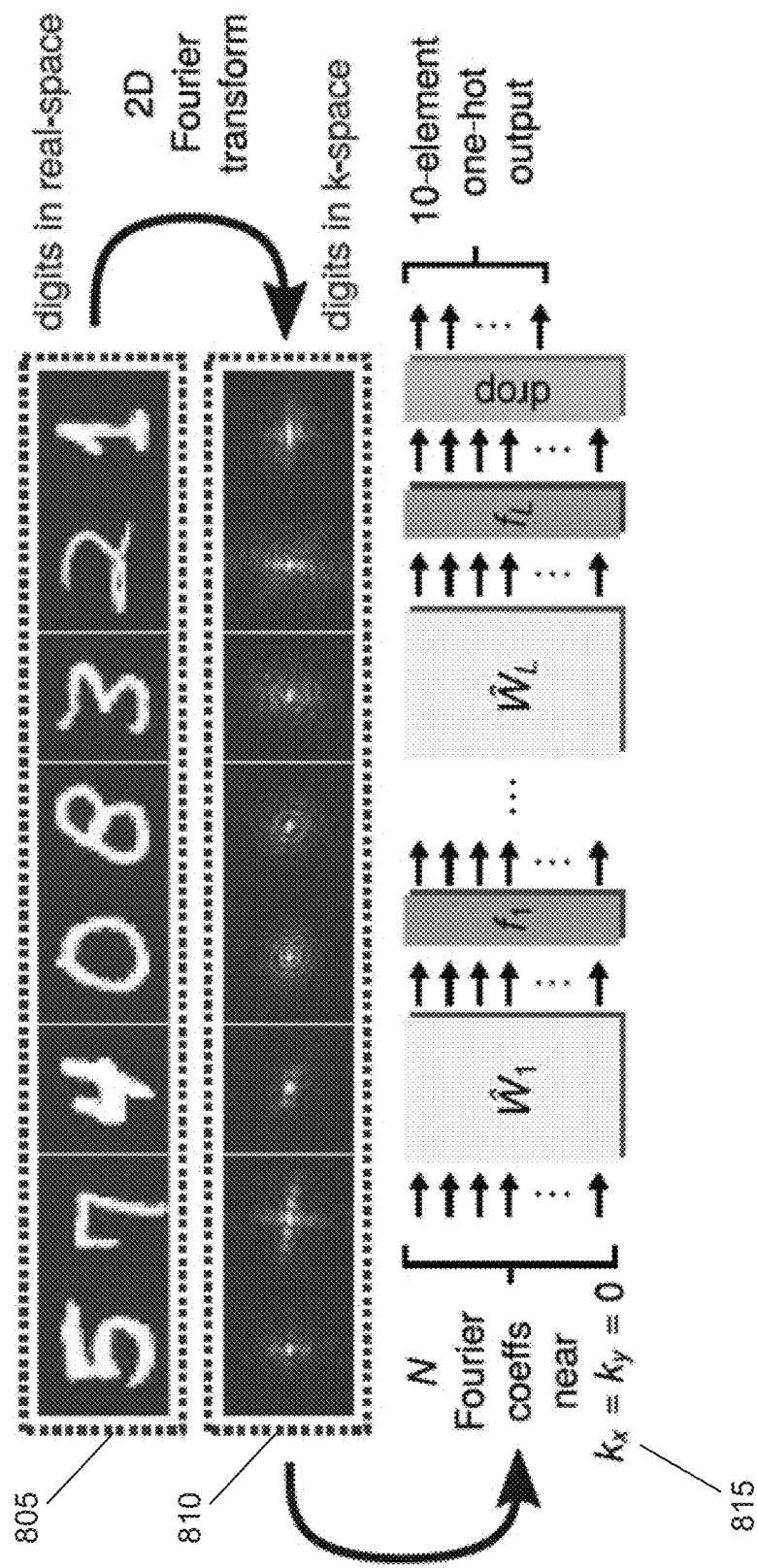
FIG. 8 illustrates charts of a handwritten number recognition example.

To reduce the number of input parameters, and hence the size of the neural network, processes in accordance with a number of embodiments of the invention use a preprocessing step to convert the images into a Fourier-space representation. A 2D Fourier transform of the images can be defined mathematically as $c(k_x,k_y)=\sum_{m,n}e^{jk_x m+jk_y n}g(m,n)$, where $g(m,n)$ is the gray scale value of the pixel at location (m,n) within the image. Charts of a handwritten number recognition example are illustrated in FIG. 8. The amplitudes 810 of the Fourier coefficients $c(k_x,k_y)$ are shown below their corresponding images 805 in FIG. 8. These coefficients are generally complex-valued, but because the real-space map $g(m,n)$ is real-valued, the condition $c(k_x,k_y)=c^*(-k_x,-k_y)$ applies.

The Fourier-space profiles are mostly concentrated around small $k_x$ and $k_y$, corresponding to the center region of the profiles in FIG. 8. This is due to the slowly varying spatial features in the images. Most of the information is carried by the small k Fourier components, and with the goal of decreasing the input size, the data can be restricted to N coefficients with the smallest $k=\sqrt{k_x^2+k_y^2}$. An additional advantage of this preprocessing step in accordance with many embodiments of the invention is that it reduces the computational resources required to perform the training process because the neural network dimension does not need to accommodate all $28^2$ pixel values as inputs.

Fourier preprocessing can be particularly relevant for ONNs for two reasons. First, the Fourier transform has a straightforward implementation in the optical domain using a lens and a spatial filter for selecting the desired components. Second, this approach can take advantage of the fact that ONNs are complex-valued functions. That is to say, the N complex-valued coefficients $c(k_x,k_y)$ contain 2N degrees of freedom which could only be handled by a real-valued neural network using a twice larger dimension. The ONN architecture 815 used in this example is shown schematically in FIG. 8. The N Fourier coefficients close to $k_x=k_y=0$ are fed into an optical neural network consisting of L layers, after which a drop-mask reduces the final output to 10 components which are used for one-hot encoding the digits from 0 to 9. The loss function is defined as the cross-entropy between the intensity of the output vector and the correct one-hot vector. In various embodiments, this final transformation could be performed directly by an array of photodiodes.

Figure 9:
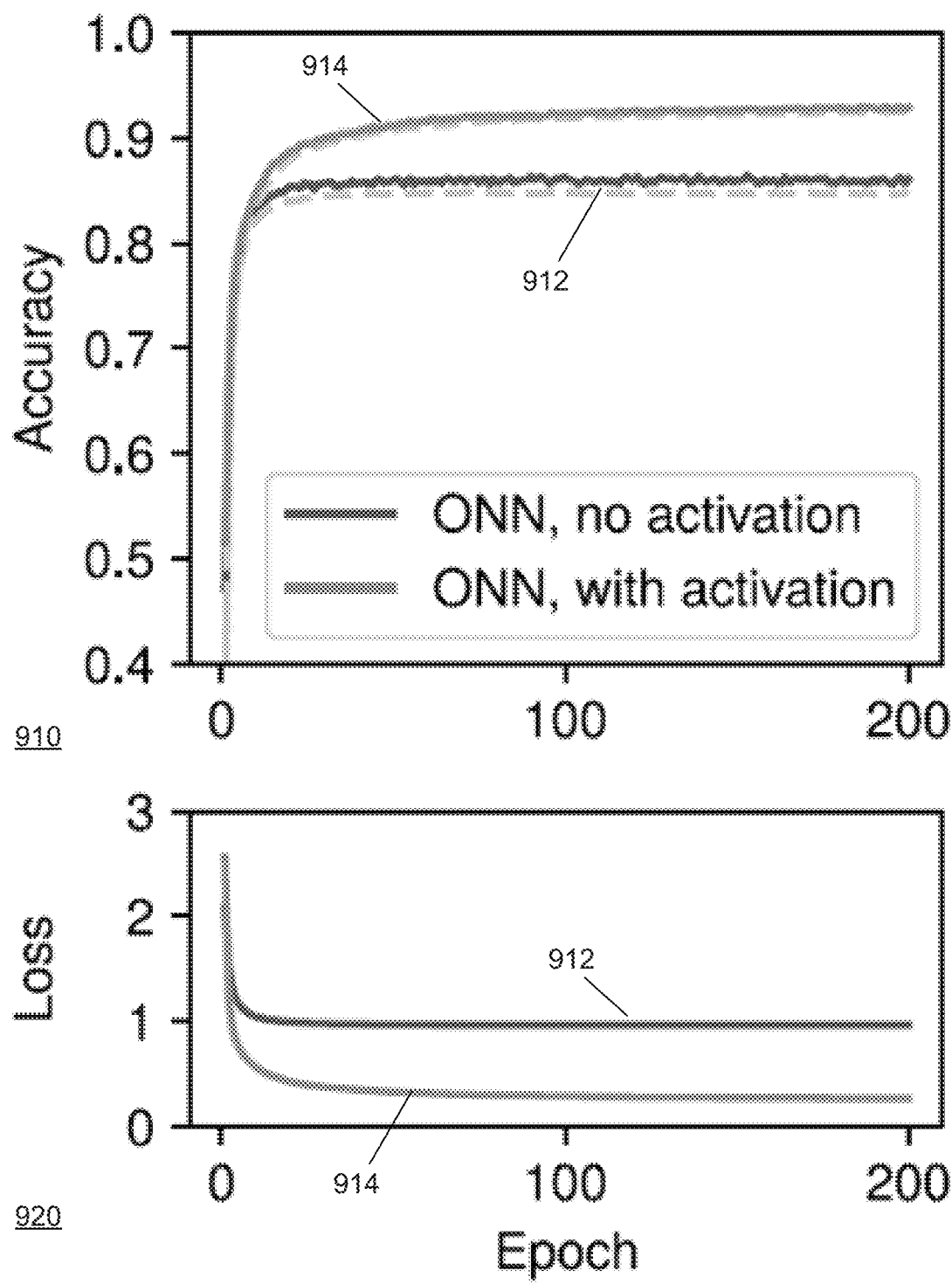
FIG. 9 illustrates charts of comparisons between the validation accuracy and the loss function value during training for a two-layer network.
Figure 10:
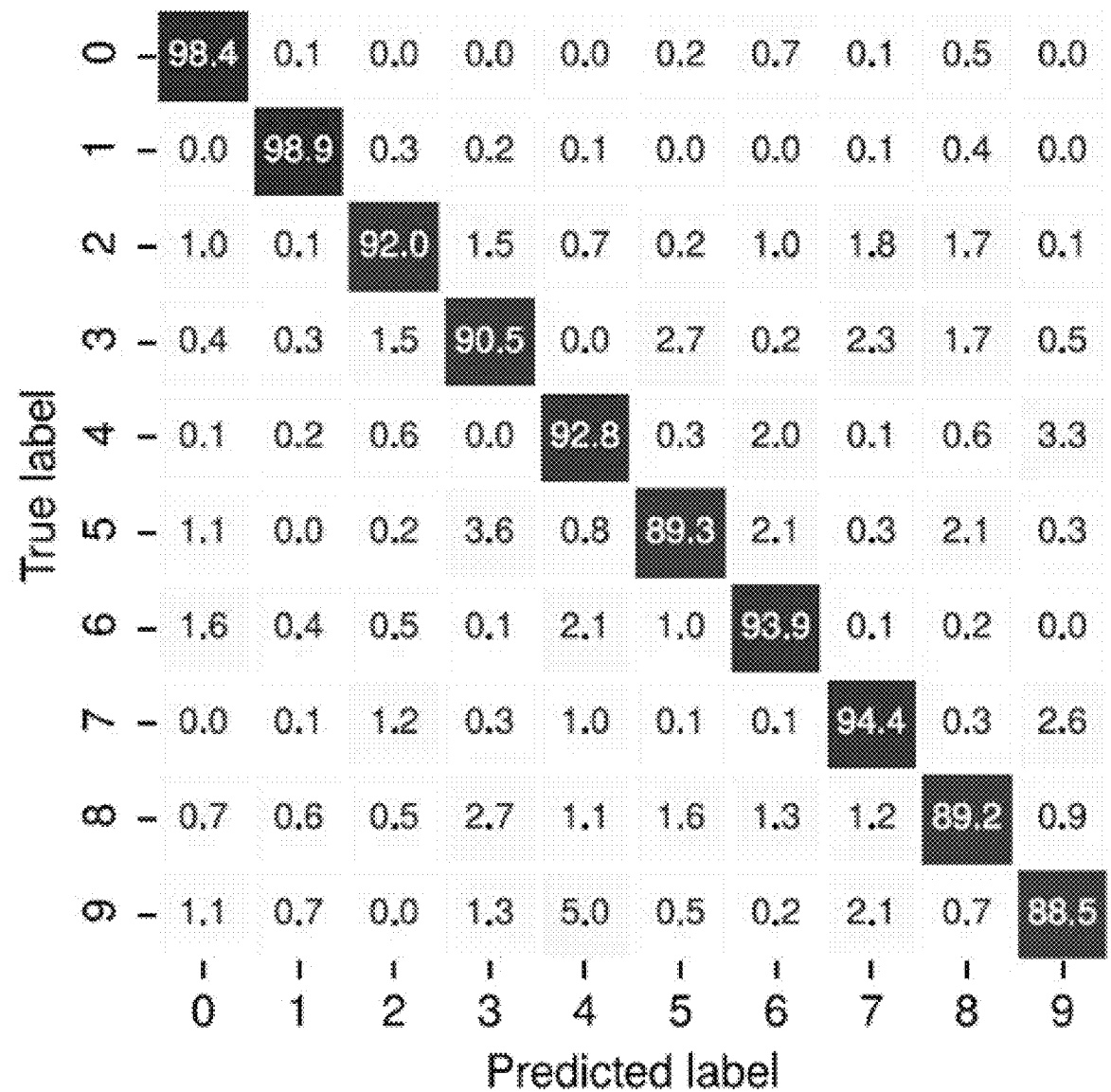
FIG. 10 illustrates a confusion matrix for the trained ONN with an electro-optic activation function.

During each training epoch a subset of 60,000 images from the dataset were fed through the network in batches of 500. The remaining 10,000 image-label pairs were used for validation. Charts 910 and 920 of FIG. 9 illustrate comparisons between the validation accuracy and the loss function value during training for a two-layer network with N=16 input Fourier components. The blue curves 912 correspond to an ONN with no activation function while the orange curves 914 correspond to an ONN with an electro-optic activation function configured with $g_\phi=0.05\pi$ and $\phi_b=1.00\pi$. A confusion matrix for the trained ONN with an electro-optic activation function is illustrated in FIG. 10. The gain setting in particular was selected heuristically. The nonlinear activation function can result in a significant improvement to the ONN performance during and after training. The final validation accuracy for the ONN with the activation function is 93%, which amounts to an 8% difference as compared to the linear ONN which achieved an accuracy of 85%.

The confusion matrix 1000 corresponds to the validation data feed through the ONN with activation functions. The predicted accuracy of 93% is high considering that only N=16 complex Fourier components were used, and the network is parameterized by only $2\times N^2=512$ free parameters. This is comparable to the performance of a fully-connected linear classifier which takes all real-space bits as inputs and has 4010 free parameters and a validation accuracy of 92.6%. Finally, the table below shows a summary of validation accuracies after 200 epochs for an ONN without activations, with activations, and with trained activations. For the trained activations, the gain, $g_\phi$, of each layer was optimized. The table shows that the accuracy can be further improved by including a third layer in the ONN and by making the activation function gain a trainable parameter. This brings the validation accuracy to 94%.

| Layers | No activation | Activation | Trained activation |
| --- | --- | --- | --- |
| 1 | 0.8506 | 0.8980 | 0.8938 |
| 2 | — | 0.9298 | 0.9260 |
| 3 | — | 0.9262 | 0.9389 |

In some embodiments, an architecture for synthesizing optical-to-optical nonlinearities and its use in a feed forward ONN is provided. Rather than using optical nonlinearities, activation architectures in accordance with numerous embodiments of the invention can use intermediate signal pathways in the electrical domain which can be accessed via photodetectors and phase modulators. Specifically, in several embodiments, a small portion of the optical input power can be tapped out which undergoes analog processing before modulating the remaining portion of the same optical signal. Whereas all-optical nonlinearities have largely fixed responses, a benefit of the electro-optic approach demonstrated here is that signal amplification in the electronic domain can overcome the need for high optical signal powers to achieve a significantly lower activation threshold. For example, a phase modulator $V_\pi$ of 10 V and an optical-to-electrical conversion gain of 57 dBΩ, both of which are experimentally feasible, result in an optical activation threshold of 0.1 mW.

Activation function architectures in accordance with a number of embodiments of the invention can utilize the same integrated photodetector and modulator technologies as the input and output layers of a fully-integrated ONN. An ONN using this activation can suffer no reduction in processing speed, despite using analog electrical components. While there is potentially an increase in latency due to the electro-optic conversion process, an ONN with dimension N=100 has approximately equal contributions to its total latency from propagation of optical pulses through the interferometer mesh as from the electro-optic activation function. This latency amounts to 2.4 ns per layer.

In many embodiments, the majority of the signal power is always transferred in the optical domain. This can eliminate the requirement of having a new optical source at each nonlinear layer of the network, as is required in previously demonstrated electro-optic neuromorphic hardware and reservoir computing architectures. Additionally, each activation function in accordance with certain embodiments of the invention is a standalone analog circuit and therefore can be applied in parallel. Finally, while many of the examples have been described to implement an architecture as an activation function in a feedforward ONN, the synthesis of low-threshold optical nonlinearlities using this circuit could be of broader interest to a number of different fields, including (but not limited to) optical computing and microwave photonics.

Although the present invention has been described in certain specific aspects, many additional modifications and variations would be apparent to those skilled in the a rt. It is therefore to be understood that the present invention may be practiced otherwise than specifically described. Thus, embodiments of the present invention should be considered in all respects as illustrative and not restrictive.

What is claimed is:

1. An optical activation circuit, wherein the circuit comprises:
   a directional coupler;
   an optical-to-electrical conversion circuit;
   a time delay element;
   a nonlinear signal conditioner; and
   a phase shifter, wherein:
      the directional coupler receives an optical input and provides a first portion to the optical-to-electrical conversion circuit and a second portion to the time delay element;
      the time delay element provides a delayed signal to the phase shifter; and
      the optical-to-electrical conversion circuit converts an optical signal from the directional coupler to an electrical signal used to activate the phase shifter to shift the phase of the delayed signal.

2. The circuit of claim 1, wherein the nonlinear signal conditioner performs a nonlinear transformation of a voltage from the optical-to-electrical conversion circuit.

3. The circuit of claim 2, further comprising an element to add a static bias voltage to the electrical signal used to activate the phase shifter.

4. The circuit of claim 1, wherein the phase shifter is embedded in an interferometer to modulate the intensity of the delayed signal.

5. The circuit of claim 4, wherein the interferometer is a Mach-Zehnder interferometer.

6. The circuit of claim 1, wherein the optical-to-electrical conversion circuit comprises a photodetector.

7. The circuit of claim 6, wherein the optical-to-electrical conversion circuit further comprises a signal amplifier.

8. The circuit of claim 7, wherein the signal amplifier is a semiconductor optical amplifier.

* * * * *